(12) United States Patent
Tamura et al.

(10) Patent No.: US 7,875,530 B2
(45) Date of Patent: Jan. 25, 2011

(54) METHOD FOR MANUFACTURING SEMICONDUCTOR DEVICE

(75) Inventors: Tomoko Tamura, Kanagawa (JP); Tomoyuki Aoki, Kanagawa (JP); Takuya Tsurume, Tochigi (JP); Koji Dairiki, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 374 days.

(21) Appl. No.: 11/602,261

(22) Filed: Nov. 21, 2006

(65) Prior Publication Data

US 2007/0128747 A1 Jun. 7, 2007

(30) Foreign Application Priority Data

Dec. 2, 2005 (JP) .............................. 2005-348872

(51) Int. Cl.
H01L 21/00 (2006.01)
H01L 21/46 (2006.01)
H01L 21/30 (2006.01)

(52) U.S. Cl. .................. 438/458; 438/464; 438/33; 438/113; 438/118

(58) Field of Classification Search ............... 438/458, 438/464
See application file for complete search history.

(56) References Cited

U.S. PATENT DOCUMENTS

| | | | |
|---|---|---|---|
| 6,341,216 B1 | 1/2002 | Itoh | |
| 6,372,608 B1 * | 4/2002 | Shimoda et al. | 438/455 |
| 6,425,971 B1 * | 7/2002 | Silverbrook | 156/230 |
| 6,512,288 B1 * | 1/2003 | Shin et al. | 257/678 |
| 6,570,263 B1 * | 5/2003 | Wu et al. | 257/797 |
| 6,867,072 B1 * | 3/2005 | Shiu et al. | 438/123 |
| 6,939,785 B2 * | 9/2005 | Kajiyama et al. | 438/463 |
| 7,005,319 B1 * | 2/2006 | Chen et al. | 438/107 |
| 7,087,502 B2 * | 8/2006 | Priewasser et al. | 438/464 |

(Continued)

FOREIGN PATENT DOCUMENTS

CN 1203710 12/1998

(Continued)

OTHER PUBLICATIONS

Chinese Office Action (Application No. 2006/10163786.4) dated Dec. 4, 2009.

*Primary Examiner*—Walter L Lindsay, Jr.
*Assistant Examiner*—Pape Sene
(74) *Attorney, Agent, or Firm*—Nixon Peabody LLP; Jeffrey L. Costellia

(57) ABSTRACT

First semiconductor integrated circuits and second semiconductor integrated circuits arranged over a first substrate so that each of the second semiconductor integrated circuits is adjacent to one of the first semiconductor integrated circuits are transferred to additional substrates through multiple transfer operations. After the first semiconductor integrated circuits and the second semiconductor integrated circuits formed over the first substrate are transferred to the additional substrates (a fourth substrate and a fifth substrate) respectively, the circuits are divided into a semiconductor device corresponding to each semiconductor integrated circuit. The first semiconductor integrated circuits are arranged while keeping a distance from each other over the fourth substrate, and the second semiconductor integrated circuits are arranged while keeping a distance from each other over the fifth substrate. Thus, a large division margin of each of the fourth substrate and the fifth substrate can be obtained.

40 Claims, 16 Drawing Sheets

U.S. PATENT DOCUMENTS

| | | | |
|---|---|---|---|
| 2003/0073264 A1* | 4/2003 | Meguro et al. | 438/113 |
| 2004/0247236 A1* | 12/2004 | Yoshimura et al. | 385/16 |
| 2004/0262722 A1* | 12/2004 | Sekiguchi | 257/676 |
| 2005/0106839 A1* | 5/2005 | Shimoda et al. | 438/458 |
| 2005/0158904 A1* | 7/2005 | Hayashi et al. | 438/34 |
| 2006/0013680 A1* | 1/2006 | Haba et al. | 414/935 |
| 2007/0128833 A1* | 6/2007 | Aoki et al. | 438/460 |
| 2007/0197002 A1* | 8/2007 | Kurosawa et al. | 438/460 |

FOREIGN PATENT DOCUMENTS

| | | |
|---|---|---|
| EP | 0 878 918 A1 | 11/1998 |
| JP | 2005-311333 | 11/2005 |
| WO | WO 2005/091370 A1 | 9/2005 |

* cited by examiner

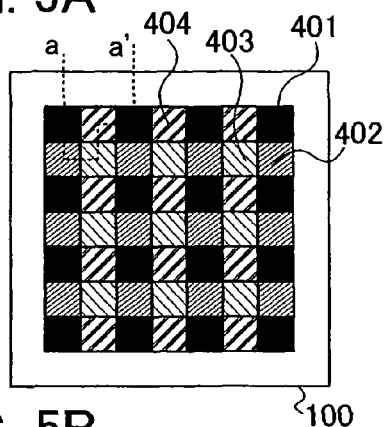

| | X1 | X2 | X3 | X4 |
|---|---|---|---|---|
| a | 100 | 100 | 100 | 100 |
| b | 501 | 502 | 503 | 504 |
| c | 307 306 | 306 | 306 | 306 |
| d | | | | |
| e | | | | |

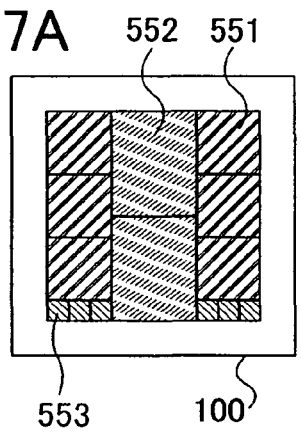

3000

3000

3000

3000

3000

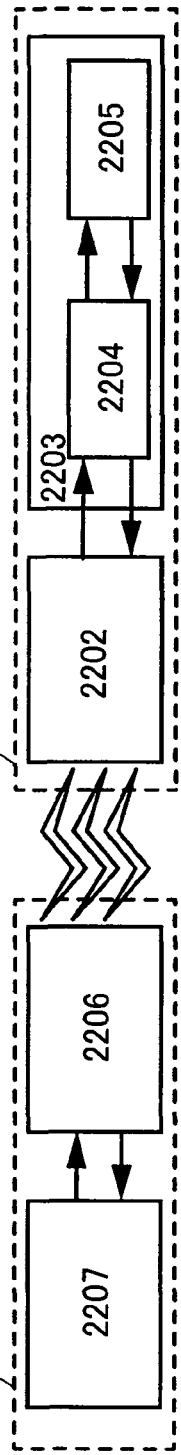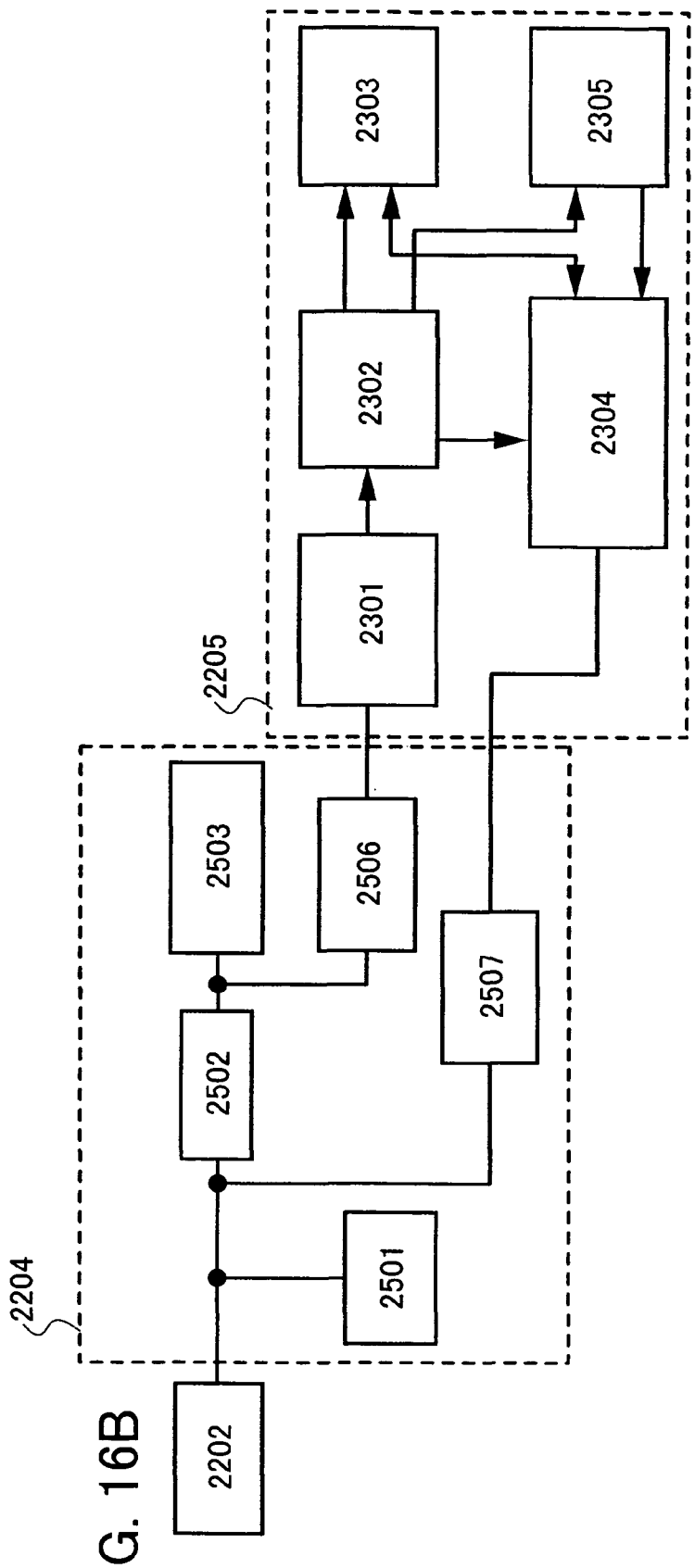
FIG. 16A
FIG. 16B

METHOD FOR MANUFACTURING SEMICONDUCTOR DEVICE

BACKGROUND OF THE INVENTION

1. Field of the Invention

The present invention relates to a method for manufacturing a semiconductor device. The present invention relates to a method for manufacturing a semiconductor device which inputs and outputs data by wireless communication.

2. Description of the Related Art

A method for manufacturing a semiconductor device provided with a semiconductor integrated circuit over a flexible substrate has been proposed. In this method, first, a plurality of semiconductor integrated circuits is formed using a thin film transistor over a first substrate, which is not flexible and is formed from a thick glass or the like. The plurality of semiconductor integrated circuits is formed while keeping a predetermined distance from each other over the first substrate. The plurality of semiconductor integrated circuits is transferred from the first substrate to a flexible second substrate. The plurality of semiconductor integrated circuits is completely transferred from the first substrate to the second substrate concurrently; therefore, also over the second substrate, the plurality of semiconductor integrated circuits is aligned while keeping the predetermined distance from each other. Thereafter, the second substrate is divided so as to divide the semiconductor integrated circuits into separate pieces, thereby obtaining a plurality of semiconductor devices (refer to description in Patent Document 1: Japanese Published Patent Application No. 2005-311333). The predetermined distance becomes a margin for division (hereinafter, referred to as a division margin or a scribe margin) when obtaining the plurality of semiconductor devices by dividing the second substrate.

In a conventional method for manufacturing a semiconductor device, providing a division margin has been necessary. Accordingly, it has been difficult to increase the number of semiconductor integrated circuits that can be manufactured over one first substrate, and therefore, it has been difficult to increase the number of semiconductor devices that can be manufactured at once by using one first substrate. Thus, semiconductor device costs have been high.

In addition, if the division margin is not sufficiently secured in order to increase the number of semiconductor devices, a semiconductor integrated circuit is more likely to be damaged when being divided. Therefore, it has been difficult to ensure reliability of the semiconductor integrated circuit.

SUMMARY OF THE INVENTION

In view of the above, it is an object of the present invention to provide a method for manufacturing a highly reliable semiconductor device at low cost.

One feature of the present invention is a method for manufacturing a semiconductor device by which a plurality of semiconductor integrated circuits formed over a first substrate is transferred to additional substrates through multiple transfer operations (hereinafter, referred to as "a transfer method through multiple transfer operations").

In particular, one feature of the present invention is to use multiple types of insulating layers (a first insulating layer and a second insulating layer) as an insulating layer for adhesion between semiconductor integrated circuits and an additional substrate when transferring a plurality of semiconductor integrated circuits to the additional substrate. Adhesion force between each of the first insulating layer and second insulating layer and the semiconductor integrated circuits differs. The first insulating layer is selectively formed over some of the circuits of the plurality of semiconductor integrated circuits formed over the first substrate, and the second insulating layer is selectively formed over rest of the circuits of plurality of the semiconductor integrated circuits formed over the first substrate. An additional substrate, which differs from the first substrate, is provided over the first insulating layer and the second insulating layer to separate the first substrate and the additional substrate from each other. Accordingly, the semiconductor integrated circuits over which the first insulating layer is formed are not transferred to the additional substrate, but the semiconductor integrated circuits over which the second insulating layer is formed are transferred to the additional substrate (the first transfer). At this time, the semiconductor integrated circuits that have not been transferred to the additional substrate remain over the first substrate. After the first transfer, the semiconductor integrated circuits are transferred to a new additional substrate (the second transfer). In this manner, the plurality of semiconductor integrated circuits formed over the first substrate can be transferred to the additional substrate, selectively. Accordingly, the plurality of semiconductor integrated circuits formed over the first substrate can be transferred to the additional substrates through multiple transfer operations.

The plurality of semiconductor integrated circuits formed over the first substrate may have the same configuration or different configurations. For example, the plurality of semiconductor integrated circuits formed over the first substrate may have the same layout or different layouts.

(A method for manufacturing a semiconductor device by a transfer method through multiple transfer operations)

Another feature of the present invention is a method for manufacturing a semiconductor device by which a plurality of first semiconductor integrated circuits and a plurality of second semiconductor integrated circuits arranged so that each of the second semiconductor integrated circuits is adjacent to one of the first semiconductor integrated circuits are formed over a first substrate; a second substrate is attached so as to cover the first semiconductor integrated circuits and the second semiconductor integrated circuits; thereafter, the first substrate and the second substrate are separated from each other and the first semiconductor integrated circuits are transferred to the second substrate (first transfer); a third substrate is attached so as to cover the second semiconductor integrated circuits remaining over the first substrate; thereafter, the first substrate and the third substrate are separated from each other and the second semiconductor integrated circuits are transferred to the third substrate (second transfer); the second substrate is divided so as to divide the plurality of first semiconductor integrated circuits into separate pieces; and the third substrate is divided so as to divide the plurality of second semiconductor integrated circuits into separate pieces.

By a method for manufacturing a semiconductor device of the present invention, a plurality of first semiconductor integrated circuits and a plurality of second semiconductor integrated circuits arranged so that each of which is adjacent to one of the first semiconductor integrated circuits are formed over a first substrate; a first insulating layer is formed so as to cover the second semiconductor integrated circuits; a second insulating layer is formed so as to cover the first semiconductor integrated circuits; a second substrate is attached so as to cover the first insulating layer and the second insulating layer; the first substrate and the second substrate are separated from each other by adding a first external force between the second substrate and the first substrate, and the first semiconductor integrated circuits are transferred to the second substrate (the first transfer); a third substrate is attached so as to cover the second semiconductor integrated circuits remaining over the first substrate; the first substrate and the third substrate are separated from each other by adding a second external force between the first substrate and the third substrate, and the second semiconductor integrated circuits are transferred to the third substrate (the second transfer); the second substrate is divided so as to divide the plurality of first semiconductor integrated circuits into separate pieces; and the third substrate is divided so as to divide the plurality of second semiconductor integrated circuits into separate pieces.

The second insulating layer may be formed so as to cover an edge portion of the first insulating layer or may be formed so as not to cover the edge portion of the first insulating layer.

It is to be noted that, after the first semiconductor integrated circuits are transferred to the second substrate, a plurality of first semiconductor integrated circuits are further transferred to a fourth substrate, and the fourth substrate is divided so as to divide the plurality of first semiconductor integrated circuits into separate pieces. Moreover, after the second semiconductor integrated circuits are transferred to the third substrate, a plurality of second semiconductor integrated circuits is further transferred to a fifth substrate, and the fifth substrate may be divided so as to divide the plurality of second semiconductor integrated circuits into separate pieces.

It is to be noted that, with respect to the first external force, the junction (adhesive) strength between the second insulating layer and the first semiconductor integrated circuits is made to be higher than the junction (adhesive) strength between the first insulating layer and the second semiconductor integrated circuits and is made to be higher than the junction strength between the first substrate and the first semiconductor integrated circuits. In addition, with respect to the first external force, the junction strength between the first substrate and the second semiconductor integrated circuits is made to be higher than the junction (adhesive) strength between the first insulating layer and the second semiconductor integrated circuits. The second insulating layer can be formed using an epoxy-based resin material (a resin material having an epoxy group), and the first insulating layer can be formed using a vinyl-based resin material (a resin material having a vinyl group).

The first semiconductor integrated circuits and the second semiconductor integrated circuits can be formed over the first substrate at the same time (can be formed by the same process). The first semiconductor integrated circuits and the second semiconductor integrated circuits may have the same structure or may have different structures.

The heat resistance of the first substrate can be made higher than that of the second to fifth substrates. The heat-resistant property indicates a strain point, a melting point, or a glass transition point.

A method for manufacturing a semiconductor device of the present invention can be a method for manufacturing a semiconductor device by which first semiconductor integrated circuits or second semiconductor integrated circuits are electrically connected to an antenna and data is input and output by wireless communication through the antenna. The antenna can be formed when forming the first semiconductor integrated circuits and the second semiconductor integrated circuits over a first substrate. It is to be noted that the antenna may be formed over a substrate which differs from the first substrate.

(A method for manufacturing a semiconductor device by a transfer method through four transfer operations)

By a method for manufacturing a semiconductor device of the present invention, over a first substrate, a plurality of first semiconductor integrated circuits; a plurality of second semiconductor integrated circuits arranged so that each of the second semiconductor integrated circuits is adjacent to one of the first semiconductor integrated circuits; a plurality of third semiconductor integrated circuits arranged so that each of the third semiconductor integrated circuits is adjacent to one of the first semiconductor integrated circuits and one of the second semiconductor integrated circuits; and a plurality of fourth semiconductor integrated circuits arranged so that each of the fourth semiconductor integrated circuits is adjacent to one of the first semiconductor integrated circuits, one of the second semiconductor integrated circuits, and one of the third semiconductor integrated circuits are formed.

A first insulating layer is formed so as to cover the second semiconductor integrated circuits, the third semiconductor integrated circuits, and the fourth semiconductor integrated circuits. A second insulating layer is formed so as to cover the first semiconductor integrated circuits. A second substrate is attached so as to cover the first insulating layer and the second insulating layer. The first substrate and the second substrate are separated from each other by adding a first external force between the first substrate and the second substrate, and the first semiconductor integrated circuits are transferred to the second substrate (the first transfer).

A third insulating layer is formed so as to cover the third semiconductor integrated circuits and the fourth semiconductor integrated circuits remaining over the first substrate. A fourth insulating layer is formed so as to cover the second semiconductor integrated circuits. A third substrate is attached so as to cover the third insulating layer and the fourth insulating layer. The first substrate and the third substrate are separated from each other by adding a second external force between the first substrate and the third substrate, and the second semiconductor integrated circuits are transferred to the third substrate (the second transfer).

A fifth insulating layer is formed so as to cover the fourth semiconductor integrated circuits remaining over the first substrate. A sixth insulating layer is formed so as to cover the third semiconductor integrated circuits. A fourth substrate is attached so as to cover the fifth insulating layer and the sixth insulating layer. The first substrate and the fourth substrate are separated from each other by adding a third external force between the first substrate and the fourth substrate, and the third semiconductor integrated circuits are transferred to the fourth substrate (the third transfer).

A fifth substrate is attached so as to cover the fourth semiconductor integrated circuits remaining over the first substrate. The first substrate and the fifth substrate are separated from each other by adding an external force between the first substrate and the fifth substrate, and the fourth semiconductor integrated circuits are transferred to the fifth substrate (the fourth transfer).

The second substrate is divided so as to divide the plurality of first semiconductor integrated circuits into separate pieces. The third substrate is divided so as to divide the plurality of second semiconductor integrated circuits into separate pieces. The fourth substrate is divided so as to divide the plurality of third semiconductor integrated circuits into separate pieces. The fifth substrate is divided so as to divide the plurality of fourth semiconductor integrated circuits into separate pieces.

The second insulating layer may be formed so as to cover an edge portion of the first insulating layer or may be formed so as not to cover the edge portion thereof. The fourth insulating layer may be formed so as to cover an edge portion of the third insulating layer or may be formed so as not to cover the edge portion thereof. The sixth insulating layer may be formed so as to cover an edge portion of the fifth insulating layer or may be formed so as not to cover the edge portion thereof.

It is to be noted that, after the first semiconductor integrated circuits are transferred to the second substrate, the plurality of first semiconductor integrated circuits may be further transferred to a sixth substrate, and the sixth substrate may be divided so as to divide the plurality of first semiconductor integrated circuits into separate pieces. After the second semiconductor integrated circuits are transferred to the third substrate, the plurality of second semiconductor integrated circuits may be further transferred to a seventh substrate, and the seventh substrate may be divided so as to divide the plurality of second semiconductor integrated circuits into separate pieces. After the third semiconductor integrated circuits are transferred to the fourth substrate, the plurality of third semiconductor integrated circuits may be further transferred to an eighth substrate so as to divide the plurality of third semiconductor integrated circuits into separate pieces. After the fourth semiconductor integrated circuits are transferred to the fifth substrate, the plurality of fourth semiconductor integrated circuits may be further transferred to a ninth substrate, and the ninth substrate may be divided so as to divide the plurality of fourth semiconductor integrated circuits into separate pieces.

It is to be noted that, with respect to the first external force, the junction (adhesive) strength between the second insulating layer and the first semiconductor integrated circuits is made to be higher than the junction (adhesive) strength between the first insulating layer and each of the second to fourth semiconductor integrated circuits, and is made to be higher than the junction strength between the first substrate and the first semiconductor integrated circuits. With respect to the first external force, the junction strength between the first substrate and each of the second to fourth semiconductor integrated circuits is made to be higher than the junction (adhesive) strength between the first insulating layer and each of the second to fourth semiconductor integrated circuits. With respect to the second external force, the junction (adhesive) strength between the fourth insulating layer and the second semiconductor integrated circuits is made to be higher than the junction (adhesive) strength between the third insulating layer and each of the third and fourth semiconductor integrated circuits, and is made to be higher than the junction strength between the first substrate and the second semiconductor integrated circuits. With respect to the second external force, the junction strength between the first substrate and each of the third and fourth semiconductor integrated circuits is made to be higher than the junction (adhesive) strength between the third insulating layer and each of the third and fourth semiconductor integrated circuits. With respect to the third external force, the junction (adhesive) strength between the sixth insulating layer and the third semiconductor integrated circuits is made to be higher than the junction (adhesive) strength between the fifth insulating layer and the fourth semiconductor integrated circuits, and is made to be higher than the junction strength between the first substrate and the third semiconductor integrated circuits. With respect to the third external force, the junction strength between the first substrate and the fourth semiconductor integrated circuits is made to be higher than the junction (adhesive) strength between the fifth insulating layer and the fourth semiconductor integrated circuits. The second insulating layer, the fourth insulating layer, and the sixth insulating layer can be formed using an epoxy-based resin material (a resin material having an epoxy group). The first insulating layer, the third insulating layer, and the fifth insulating layer can be formed using a vinyl-based resin material (a resin material having a vinyl group).

The first to fourth semiconductor integrated circuits can be formed over the first substrate at the same time (can be formed by the same process). The first to fourth semiconductor integrated circuits may have the same structure or may have different structures.

The heat resistance of the first substrate can be made higher than that of the second to ninth substrates.

A method for manufacturing a semiconductor device of the present invention can be applied to a method for manufacturing a semiconductor device by which any of the first to fourth semiconductor integrated circuits are electrically connected to an antenna and data is input and output by wireless communication through the antenna. The antenna can be formed when forming the first to fourth semiconductor integrated circuits over the first substrate. It is to be noted that the antenna may be formed over a substrate which differs from the first substrate.

By a method for manufacturing a semiconductor device of the present invention, after the first semiconductor integrated circuits formed over the first substrate are transferred to the second substrate, the first semiconductor integrated circuits are divided into separate pieces. Since circuits (the second semiconductor integrated circuits) are not formed to be adjacent to any of the first semiconductor integrated circuits over the second substrate, the first semiconductor integrated circuits are formed while keeping a distance from each other. In addition, after the second semiconductor integrated circuits formed over the first substrate are transferred to the third substrate, the second semiconductor integrated circuits are divided into separate pieces. Since circuits (the first semiconductor integrated circuits) are not formed to be adjacent to any of the second semiconductor integrated circuits over the third substrate, the second semiconductor integrated circuits are formed while keeping a distance from each other. Accordingly, a large division margin of the second substrate and a large division margin of the third substrate can be obtained. In addition, the number of semiconductor devices that can be manufactured from one first substrate can be increased. It is to be noted that, as an area of the semiconductor integrated circuit becomes smaller, high accuracy in dividing into each semiconductor integrated circuit is necessary; therefore, as the area of the semiconductor integrated circuit becomes smaller, an effect of the present invention is high.

In particular, with respect to the transfer method through two transfer operations, by the transfer method through four transfer operations, in each of the first to fourth semiconductor integrated circuits, a plurality of semiconductor integrated circuits can be placed while keeping a wide distance from each other. Therefore, a larger division margin can be obtained. In addition, the number of semiconductor devices that can be manufactured from one first substrate can be increased.

By making the heat resistance of the first substrate higher than that of the substrate to which the semiconductor integrated circuits are transferred, the allowable temperature of a process in manufacturing a plurality of semiconductor integrated circuits can be increased. This makes it possible to perform sufficient heat treatment; therefore, a characteristic of the semiconductor integrated circuit can be improved.

In the method for manufacturing a semiconductor device by the transfer method through two transfer operations, by forming the second insulating layer so as not to cover an edge portion of the first insulating layer, it is possible for the first insulating layer not to remain between the second insulating layer and the first semiconductor integrated circuit. Accordingly, adhesion between the second insulating layer and the first semiconductor integrated circuit is increased and reliability of the semiconductor device can be further improved. In addition, the first insulating layer can be easily removed after the first semiconductor integrated circuits are transferred to a substrate which differs from the first substrate.

Also, in the method for manufacturing a semiconductor device by the transfer method through four transfer operations, by forming the second insulating layer so as not to cover an edge portion of the first insulating layer, it is possible for the first insulating layer not to remain between the second insulating layer and the first semiconductor integrated circuit. By forming the fourth insulating layer so as not to cover an edge portion of the third insulating layer, it is possible for the third insulating layer not to remain between the fourth insulating layer and the second semiconductor integrated circuit. By forming the sixth insulating layer so as not to cover an edge portion of the fifth insulating layer, it is possible for the fifth insulating layer not to remain between the sixth insulating layer and the third semiconductor integrated circuit. Accordingly, adhesion between the second insulating layer and the first semiconductor integrated circuit, adhesion between the fourth insulating layer and the second semiconductor integrated circuit, and adhesion between the sixth insulating layer and the third semiconductor integrated circuit can be increased, and reliability of the semiconductor device can be further improved. In addition, the first insulating layer, the third insulating layer, and the fifth insulating layer can be easily removed after the first semiconductor integrated circuits, the second semiconductor integrated circuits, and the third semiconductor integrated circuits are transferred to substrates that differ from the first substrate.

As described above, a method for manufacturing a highly reliable semiconductor device at low cost can be provided.

BRIEF DESCRIPTION OF DRAWINGS

In the accompanying drawings:

FIGS. 5A and 5B are views each showing a structure of Embodiment Mode 2;

FIGS. 7A and 7B are views each showing a structure of Embodiment Mode 4;

FIGS. 16A and 16B are views each showing a structure of Embodiment 1.

DETAILED DESCRIPTION OF THE INVENTION

Figure 1A:
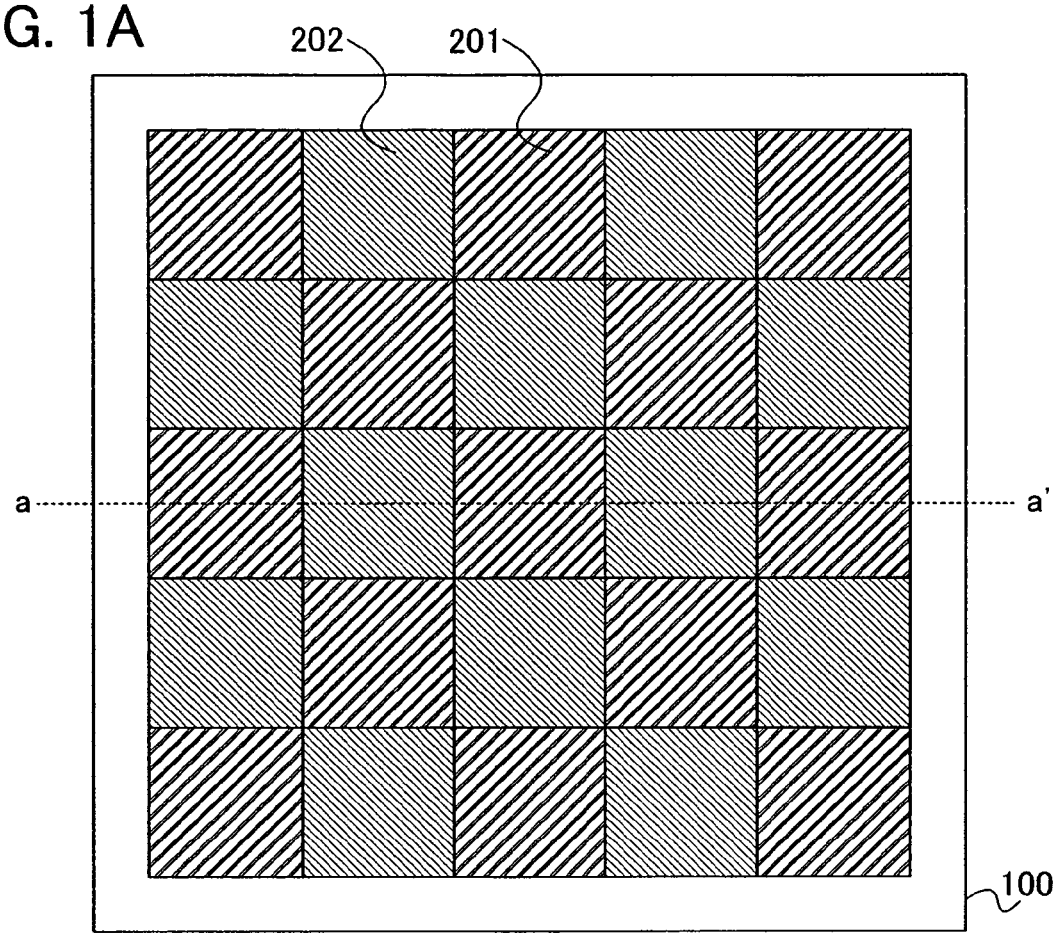
FIGS. 1A and 1B are views each showing a structure of Embodiment Mode 1.

Embodiment modes of the present invention will be explained with reference to drawings. However, the present invention is not limited to the explanation below, and it is easily understood by those skilled in the art that the modes and details can be modified in various ways without departing from the purpose and the scope of the present invention. Therefore, the present invention is not interpreted as being limited to the explanation of the embodiment modes to be given below. It is to be noted that, in the structure of the present invention hereinafter explained, the reference numerals denoting the same portions are used in common in different drawings. In the present invention, "being connected" is synonymous with "being electrically connected"; therefore, another element may be sandwiched.

Embodiment Mode 1

A method for manufacturing a semiconductor device of the present invention will be explained. In this embodiment mode, a method for manufacturing a semiconductor device by a transfer method through two transfer operations will be explained. FIGS. 1A and 1B, FIGS. 2A to 2E, FIGS. 3A to 3F, and FIG. 4 are used for the explanation.

Figure 1B:
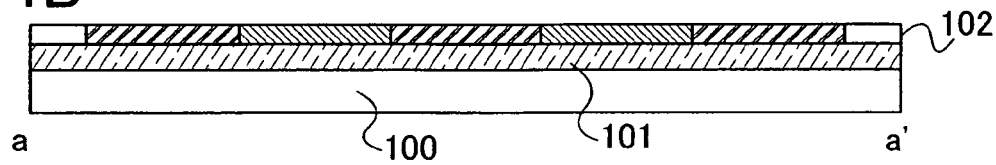

FIGS. 1A and 1B, FIGS. 2A to 2E, and FIGS. 3A to 3F are views each showing a method for manufacturing a semiconductor device of the present invention. A cross sectional view of a dashed line a-a' in FIG. 1A is shown in FIG. 1B. As shown in FIG. 1B, a peeling layer 101 is formed over a first substrate 100. First semiconductor integrated circuits 201 and second semiconductor integrated circuits 202 are formed over the peeling layer 101. As shown in FIG. 1A, over the first substrate 100, the first semiconductor integrated circuits 201 and the second semiconductor integrated circuits 202 are formed so that each of the second semiconductor integrated circuits 202 is adjacent to one of the first semiconductor integrated circuits 201. The first semiconductor integrated circuits 201 are arranged over the first substrate 100 so that the first semiconductor integrated circuits 201 are not consecutively disposed in one direction or in a direction perpendicular to the one direction. Also, the second semiconductor integrated circuits 202 are arranged over the first substrate 100 so that the second semiconductor integrated circuits 202 are not consecutively disposed in one direction or in a direction perpendicular to the one direction. Accordingly, the first semiconductor integrated circuits 201 and the second semiconductor integrated circuits 202 are arranged alternately. A layer having the first semiconductor integrated circuits 201 and the second semiconductor integrated circuits 202 is a semiconductor integrated circuit layer 102. For example, in FIGS. 1A and 1B, each of the first semiconductor integrated circuits 201 and the second semiconductor integrated circuits 202 is arranged in a rough quadrangular region.

A semiconductor substrate such as a silicon wafer, a quartz substrate, a glass substrate, or the like can be used as the first substrate 100. By using a substrate having a high heat-resistance temperature as the first substrate 100, an allowable temperature of a process in manufacturing the first semiconductor integrated circuits 201 and the second semiconductor integrated circuits 202 can be increased. Accordingly, it becomes possible to perform sufficient heat treatment, thereby improving characteristics of the first semiconductor integrated circuits 201 and the second semiconductor integrated circuits 202. In addition, a substrate having rigidity can also be used as the first substrate 100. By using the substrate having rigidity as the first substrate 100, a distortion of the first substrate 100 can be reduced, and misalignment or the like in manufacturing the first semiconductor integrated circuits 201 and the second semiconductor integrated circuits 202 can be reduced. Accordingly, reliability of the first semiconductor integrated circuits 201 and the second semiconductor integrated circuits 202 can be improved.

Figure 2A:
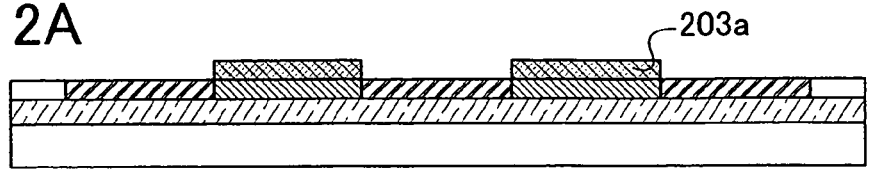
FIGS. 2A to 2E are views each showing a structure of Embodiment Mode 1.

A first resin material is applied so as to cover the second semiconductor integrated circuits 202. Thereafter, baking treatment is performed using heating means such as an oven, a hot plate, or a furnace to solidify the first resin material, and a first insulating layer 203a formed of a resin is formed (FIG. 2A). Here, a vinyl-based resin material (a resin material having a vinyl group) is used as the first resin material. For example, 503B-SH made by Asahi Chemical Research Laboratory can be used as the first resin material. A temperature of the baking treatment is greater than or equal to 130° C. and less than 150° C. When a baking treatment temperature is set to 130° C., the applied first resin material can be solidified by baking treatment for 10 minutes. It is to be noted that the first insulating layer 203a may have an insulating property to a direction parallel to the surface (top surface) of the first substrate 100 so that a plurality of semiconductor integrated circuits does not short-circuit. Consequently, the first insulating layer 203a may be formed using an anisotropic conductive material instead of the first resin material. The anisotropic conductive material has conductive particles mixed in an adhesive agent and has a conductive property in a direction perpendicular to the surface of the first substrate 100 and an insulating property in a direction parallel thereto.

Figure 2B:
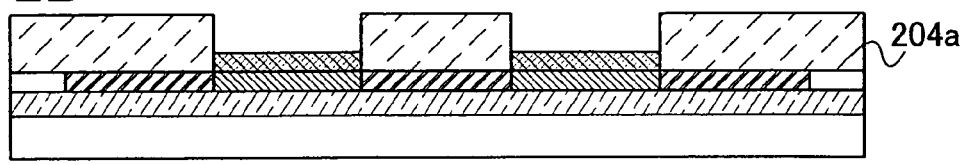

After the first insulating layer 203a is formed, a second resin material is applied so as to cover the first semiconductor integrated circuits 201. The second resin material differs from the first resin material. Thereafter, baking treatment is performed using heating means such as an oven, a hot plate, or a furnace to solidify the second resin material, and a second insulating layer 204a formed of a resin is formed (FIG. 2B). Here, as the second resin material, an epoxy-based resin material is used. As the second resin material, XN651 manufactured by Mitsui Chemicals can be used. A temperature of the baking treatment is greater than or equal to 140° C. and less than 180° C. When a baking treatment temperature is set to 160° C., the applied second resin material can be solidified by baking treatment for 30 minutes. It is to be noted that the second insulating layer 204a may have an insulating property to a direction parallel to the surface (top surface) of the first substrate so that a plurality of semiconductor integrated circuits does not short-circuit. Consequently, the second insulating layer 204a may be formed using an anisotropic conductive material instead of the second resin material. The anisotropic conductive material has conductive particles mixed in an adhesive agent and has a conductive property in a direction perpendicular to the surface of the first substrate 100 and an insulating property in a direction parallel thereto.

A printing method, a droplet discharge method, or the like can be employed as an application method of the resin material or the like for forming the first insulating layer 203a and the second insulating layer 204a. The droplet discharge method means a method for forming a predetermined pattern by discharging a droplet containing a predetermined composition from a pore. The droplet discharge method is also called an ink jet method depending on its system. The printing method means a screen printing method or an offset printing method.

In FIGS. 2A to 2E and FIGS. 3A to 3F, a structure is shown in which the first insulating layer 203a and the second insulating layer 204a do not overlap with each other.

Figure 2C:
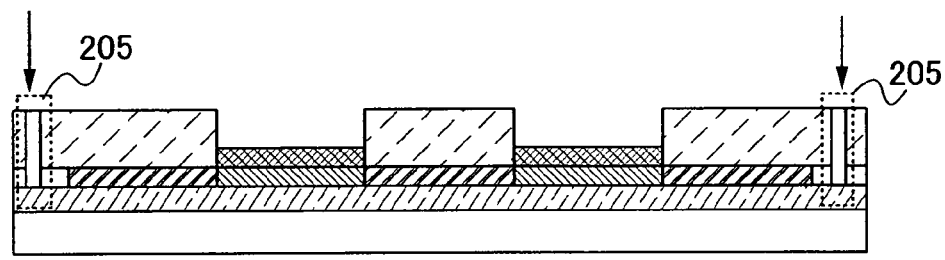

Next, an opening 205 is formed in the semiconductor integrated circuit layer 102, and the peeling layer 101 is exposed (FIG. 2C). It is preferable to provide the opening 205 in a region avoiding the first semiconductor integrated circuit 201 and the second semiconductor integrated circuit 202 constituting the semiconductor integrated circuit layer 102 or in an edge portion of the first substrate 100. Further, the opening 205 may also be provided in a boundary region between the semiconductor integrated circuits. The opening 205 can be formed by being irradiated with a laser beam, ground by a machine, or cut. Forming the opening 205 by laser beam irradiation is preferable because processing time can be shortened. When the opening 205 is provided by laser beam irradiation, by transferring an irradiated region of the laser beam, a shape of the opening 205 seen from a direction perpendicular to the top surface of the first substrate 100 can be an arbitrary shape. For example, the shape of the opening 205 seen from a direction perpendicular to the top surface of the first substrate 100 can be curved. For example, a UV laser can be used as a laser. The first substrate 100, the peeling layer 101, the semiconductor integrated circuit layer 102, and the second insulating layer 204a are irradiated with the laser beam. Also, the laser beam is emitted from the second insulating layer 204a side (a direction shown by an arrow in FIG. 2C). The opening 205 is formed so that at least part of the peeling layer 101 is exposed. Therefore, the opening 205 is provided in at least the semiconductor integrated circuit layer 102 and the second insulating layer 204a. It is to be noted that the laser beam may reach the first substrate 100. In other words, the opening 205 may be formed so as to penetrate the first substrate 100 or so as to remove part of the first substrate 100.

Figure 2D:
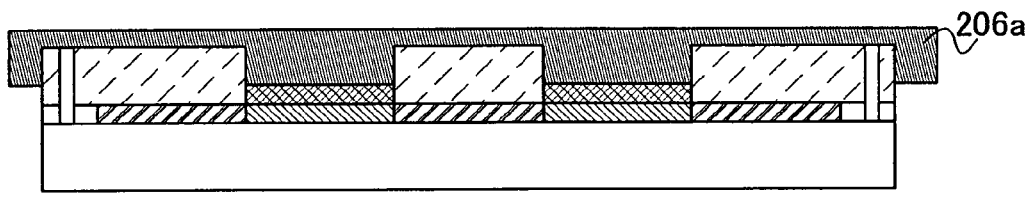

A second substrate 206a is provided over the second insulating layer 204a (FIG. 2D). The second substrate 206a is a substrate in which an insulating layer and an adhesive layer (may also be a sticking layer) are stacked and is a thermal peeling substrate. The second substrate 206a is placed so that the adhesive layer and the second insulating layer 204a are attached to each other. The thermal peeling substrate has an adhesive layer of which adhesion force is weakened by heat treatment. As the adhesive layer, for example, a layer formed of a thermoplastic adhesive agent which gets soft in heating; a layer formed of a material where a microcapsule that expands by heating or a foaming agent is mixed in; a layer formed of a material where a thermofusion property or a pyrolytic property is given to a thermosetting resin; or a layer using a material in which interface strength deteriorates due to penetration of water or using a resin which expands due to absorption of water can be used.

Figure 2E:
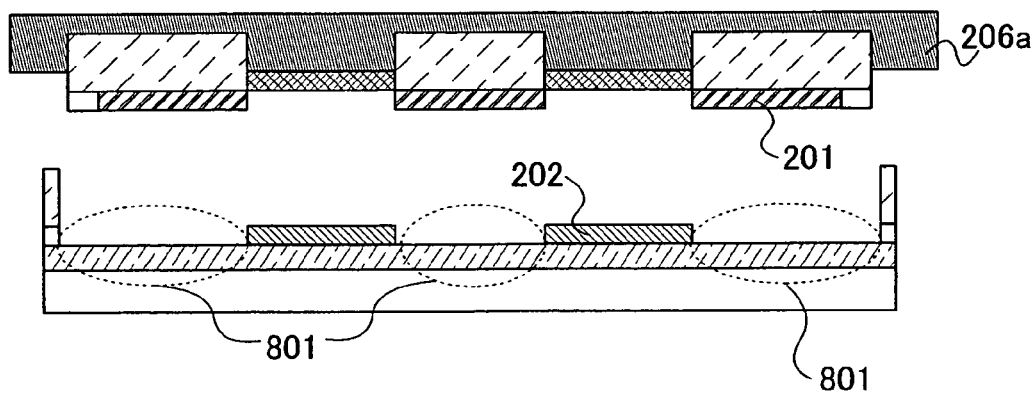

The first semiconductor integrated circuits 201 are separated from the first substrate 100 by using the second substrate 206a. At this time, an external force may be applied so that the second substrate 206a and the first substrate 100 are separated from each other. The first semiconductor integrated circuits 201 may be separated from the first substrate 100 by etching the peeling layer 101 by introducing a gas or a liquid through the opening 205. Alternatively, the first semiconductor integrated circuits 201 may be separated from the first substrate 100 by etching the peeling layer 101 by introducing a gas or a liquid from the opening 205 and further by applying an external force. For etching, for example, a gas or a liquid containing halogen fluoride or an interhalogen compound can be used. The separation of the first substrate 100 and the first semiconductor integrated circuits 201 is performed inside the peeling layer 101 or at a boundary between the peeling layer 101 and the semiconductor integrated circuit layer 102. Accordingly, the first semiconductor integrated circuits 201 are transferred to the second substrate 206a (FIG. 2E). A state of the first substrate 100 after the first semiconductor integrated circuits 201 are transferred to the second substrate 206a is shown in Column X1, Row a in FIG. 4.

Figure 3A:
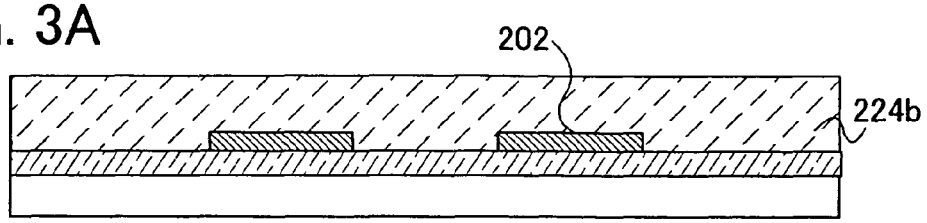
FIGS. 3A to 3F are views each showing a structure of Embodiment Mode 1.
Figure 3B:
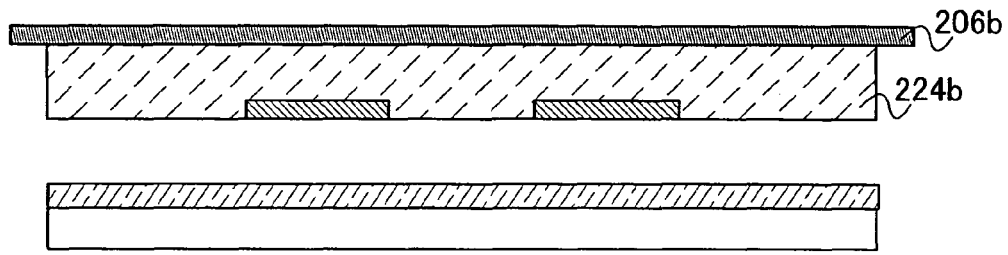

Next, a third resin material is applied over the second semiconductor integrated circuits 202 remaining over the first substrate 100 and is baked, thereby forming a third insulating layer 224b formed of a resin (FIG. 3A). The third resin material and the second resin material can be the same. Furthermore, as described above, an opening is formed by a laser beam or the like. By providing a third substrate 206b over the third insulating layer 224b and applying an external force, the first substrate 100 and the third substrate 206b are separated from each other, that is, by using physical means, the second semiconductor integrated circuits 202 are separated from the first substrate 100. As the third substrate 206b, the same material as that of the second substrate 206a can be used. Accordingly, the second semiconductor integrated circuits 202 can be transferred to the third substrate 206b (FIG. 3B). It is to be noted that the second semiconductor integrated circuits 202 can be separated by using the third substrate 206b which adheres (sticks) to the second semiconductor integrated circuits 202, without forming the third insulating layer 224b. A state of the first substrate 100 after the second semiconductor integrated circuits 202 are transferred to the third substrate 206b is shown in Column X2, Row a in FIG. 4.

In the step shown in FIG. 2E, when the separation is performed inside the peeling layer 101, a surface of a region 801 of the peeling layer 101, which overlaps with the first semiconductor integrated circuits 201, is removed. In this case, when the third insulating layer 224b is formed over the region 801 in the step shown in FIG. 3A, it is sometimes difficult to separate the third insulating layer 224b from the first substrate 100. For this reason, after the step shown in FIG. 2E, treatment for weakening adhesion with the third insulating layer 224b is performed to the region 801. As this treatment, a layer constituting the surface of the peeling layer 101 removed in the step shown in FIG. 2E can be manufactured again. Alternatively, instead of the treatment for weakening the adhesion, after the step shown in FIG. 2E, the third insulating layer 224b may be formed in only a portion other than the region 801 in the step shown in FIG. 3A.

Figure 3C:
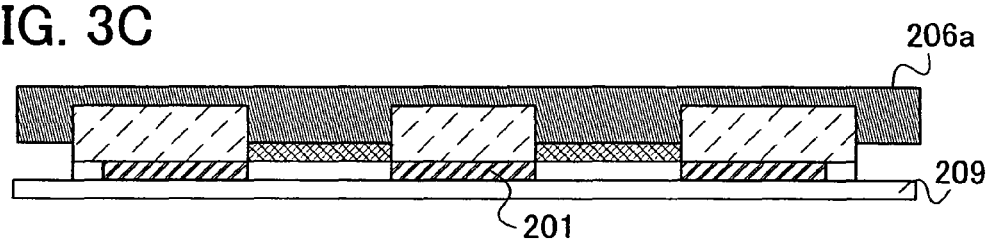
Figure 3D:
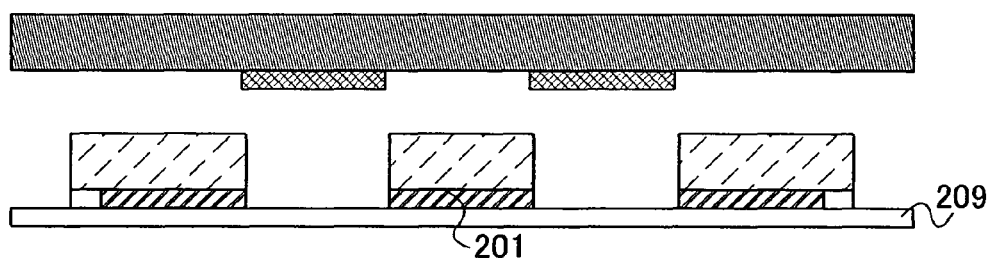
Figure 3E:
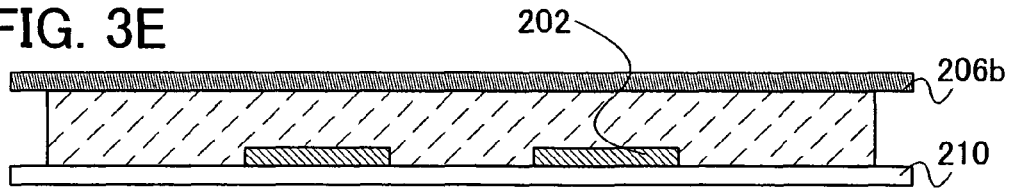
Figure 3F:
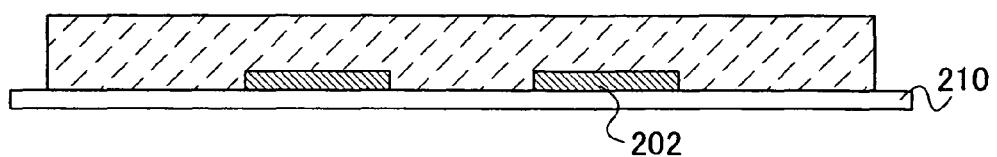

Subsequently, a fourth substrate 209 is provided over the surface of the first semiconductor integrated circuits 201 (FIG. 3C). By performing heat treatment, the first semiconductor integrated circuits 201 are separated from the second substrate 206a, and the first semiconductor integrated circuits 201 are transferred to the fourth substrate 209 (FIG. 3D). A state over the fourth substrate 209 at this time is shown in Column X1, Row b in FIG. 4. In the same way, a fifth substrate 210 is provided over the surface of the second semiconductor integrated circuits 202 (FIG. 3E). The second semiconductor integrated circuits 202 are separated from the third substrate 206b, and the second semiconductor integrated circuits 202 are transferred to the fifth substrate 210 (FIG. 3F). A state over the fifth substrate 210 at this time is shown in Column X2, Row b in FIG. 4. Each of the fourth substrate 209 and the fifth substrate 210 is a substrate in which an insulating layer and an adhesive layer are stacked. The adhesive layer increases its adhesion force by heat treatment, and corresponds to a layer containing a thermoplastic resin. The thermoplastic resin, for example, corresponds to polyethylene, polystyrene, polypropylene, polyvinyl chloride, or the like.

Figure 4:
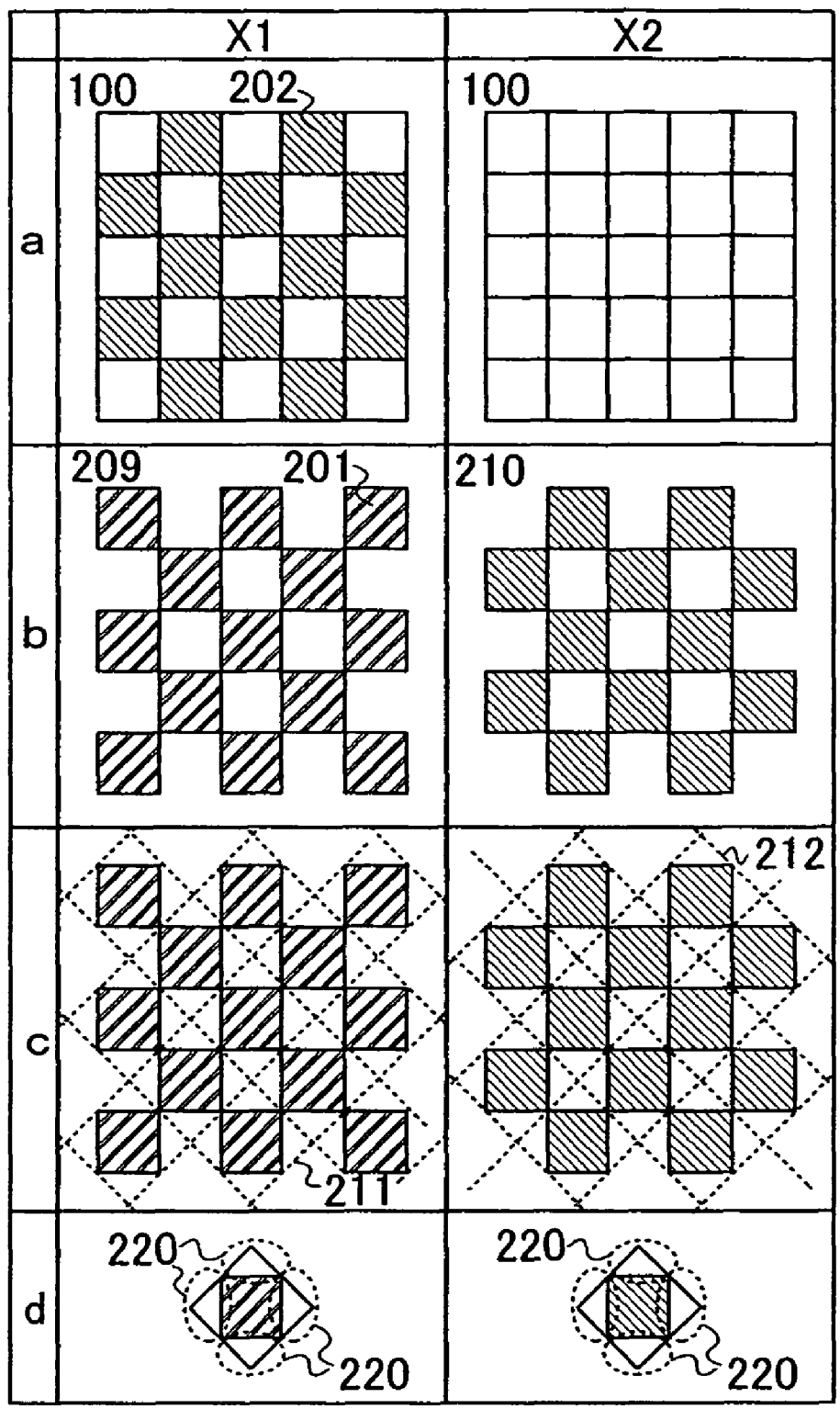
FIG. 4 is a view showing a structure of Embodiment Mode 1.

Next, a method for dividing the fourth substrate 209 and a method for dividing the fifth substrate 210 will be explained. Row c and Row d in FIG. 4 are used for the explanation.

The fourth substrate 209 is divided so that a plurality of first semiconductor integrated circuits 201 formed over the fourth substrate 209 is divided into separate pieces. Here, portions (shown by a quadrangle in the drawing) where no semiconductor integrated circuit is formed over the fourth substrate 209 are divided diagonally and are divided along lines 211 passing four corners of each of the plurality of first semiconductor integrated circuits 201 (Column X1, Row c in FIG. 4). In the same way, the fifth substrate 210 is divided along lines 212 so that a plurality of second semiconductor integrated circuits 202 formed over the fifth substrate 210 is divided into separate pieces (column X2-row c in FIG. 4). Each of the fourth substrate 209 and the fifth substrate 210 can be divided by using a laser, a cutter, a pair of scissors, or the like. In addition, each of the fourth substrate 209 and the fifth substrate 210 can be divided by using a heated wire or the like. For example, a frame of a wire formed into a division shape of the semiconductor integrated circuit is heated and the frame is pushed through, thereby dividing each of the fourth substrate 209 and the fifth substrate 210. A region 220 where no semiconductor integrated circuit is formed is formed around the first semiconductor integrated circuits 201 and the second semiconductor integrated circuits 202.

If each of the fourth substrate 209 and the fifth substrate 210 is a flexible substrate, a semiconductor device having flexibility can be manufactured. As the flexible substrate, a plastic substrate can be used. Also, a substrate formed by polishing a glass substrate or a semiconductor substrate to be thin may be used. For example, a single crystal silicon substrate having a surface perpendicular to a single crystal silicon crystal axis <100> or <110>, which is polished to have a thickness within the range of 0.1 to 20 μm, typically, a thickness within the range of 1 to 5 μm.

According to this embodiment mode, two types of semiconductor integrated circuits (the first semiconductor integrated circuits 201 and the second semiconductor integrated circuits 202) that are arranged so that each of the first semiconductor integrated circuits 201 and each of the second semiconductor integrated circuits 202 are adjacent to each other over the first substrate 100 can be transferred to additional substrates (the fourth substrate 209 and the fifth substrate 210) through multiple transfer operations. After each of the first semiconductor integrated circuits 201 and the second semiconductor integrated circuits 202 formed over the first substrate are transferred to the additional substrates (the fourth substrate 209 and the fifth substrate 210), the first semiconductor integrated circuits 201 and the second semiconductor integrated circuits 202 are divided into separate pieces. Since, over the fourth substrate 209, each of the circuits (the second semiconductor integrated circuits 202) is not arranged to be adjacent to any of the first semiconductor integrated circuits 201, the first semiconductor integrated circuits 201 are arranged while keeping a distance from each other. Also, since, over the fifth substrate 219, each of the circuits (the first semiconductor integrated circuits 201) is not arranged to be adjacent to any of the second semiconductor integrated circuits 202, the second semiconductor integrated circuits 202 are arranged while keeping a distance from each other. Accordingly, a large division margin of the fourth substrate 209 and a large division margin of the fifth substrate 210 can be obtained. In addition, the number of semiconductor devices that can be manufactured from one first substrate can be increased.

By forming the second insulating layer 204a so as not to cover an edge portion of the first insulating layer 203a, it is possible for the first insulating layer 203a not to remain between the second insulating layer 204a and the first semiconductor integrated circuit 201. Accordingly, adhesion between the second insulating layer 204a and the first semiconductor integrated circuit 201 can be increased, and reliability of the semiconductor device can be improved. In addition, the first insulating layer 203a can be easily removed after the first semiconductor integrated circuits 201 are transferred to the substrate which differs from the first substrate.

It is to be noted that, in this embodiment mode, a structure is shown in which, after the first semiconductor integrated circuits 201 transferred to the second substrate 206a are transferred to the fourth substrate 209, the first semiconductor integrated circuits 201 are divided into separate pieces by dividing the fourth substrate 209. In addition, a structure is shown in which, after the second semiconductor integrated circuits 202 transferred to the third substrate 206b are transferred to the fifth substrate 210, the second semiconductor integrated circuits are divided into separate pieces by dividing the fifth substrate 210. Without being limited thereto, a structure may be employed in which, after the first semiconductor integrated circuits 201 are transferred to the second substrate 206a, the first semiconductor integrated circuits 201 are divided into separate pieces by dividing the second substrate 206a. A structure may also be employed in which, after the second semiconductor integrated circuits 202 are transferred to the third substrate 206b, the second semiconductor integrated circuits 202 are divided into separate pieces by dividing the third substrate 206b. Accordingly, a plurality of semiconductor devices is manufactured. If each of the second substrate 206a and the third substrate 206b is a flexible substrate at this time, a semiconductor device having flexibility can be manufactured.

Although the structure is shown in this embodiment mode, in which division is performed so that the semiconductor integrated circuits are divided into separate pieces, the present invention is not limited thereto. The semiconductor integrated circuits may be divided into groups of semiconductor integrated circuits depending on the intended purpose of the semiconductor device. For example, division into a form in which a plurality of semiconductor integrated circuits aligns while keeping a distance from each other may be performed. Since a plurality of semiconductor integrated circuits is connected through a substrate in a structure in which the plurality of semiconductor integrated circuits aligns, it is possible to easily manufacture a semiconductor device having a structure in which the plurality of semiconductor integrated circuits is electrically connected to each other in series or in parallel. Also, a plurality of semiconductor integrated circuits is shipped in a state of being connected through a substrate, and thereafter, the plurality of semiconductor circuits may be further divided into separate pieces to be used. In a state where a plurality of semiconductor integrated circuits is connected to each other through the substrate, connection of the plurality of semiconductor integrated circuits and a plurality of elements can be performed collectively. For example, connection of the plurality of semiconductor integrated circuits with the plurality of elements or the like can be performed by using a roll-to-roll method. Therefore, efficiency of mass production of the semiconductor device can be improved.

Accordingly, a method for manufacturing a highly reliable semiconductor device at low cost can be provided.

Embodiment Mode 2

In this embodiment mode, a method for manufacturing a semiconductor device by using a transfer through four transfer operations will be explained. FIGS. 5A and 5B and FIGS. 12A to 12F to FIGS. 15A to 15D are used for the explanation. It is to be noted that the same portions as those in Embodiment Mode 1 are denoted by the same reference numerals.

As shown in FIG. 5A, a peeling layer 101 (FIG. 12A, not shown in FIG. 5) is formed over a first substrate 100, and first semiconductor integrated circuits 401, second semiconductor integrated circuits 402, third semiconductor integrated circuits 403, and fourth semiconductor integrated circuits 404 are formed over the peeling layer 101. It is to be noted that, over the first substrate 100, each of the first semiconductor integrated circuits 401, the second semiconductor integrated circuits 402, the third semiconductor integrated circuits 403, and the fourth semiconductor integrated circuits 404 are formed so as to be adjacent to each other. The first semiconductor integrated circuits 401 are arranged over the first substrate 100 so as not to be consecutively disposed in one direction or in a direction perpendicular to the one direction. The second semiconductor integrated circuits 402 are arranged over the first substrate 100 so as not to be consecutively disposed in one direction or in a direction perpendicular to the one direction. The third semiconductor integrated circuits 403 are arranged over the first substrate 100 so as not to be consecutively disposed in one direction or in a direction perpendicular to the one direction. The fourth semiconductor integrated circuits 404 are arranged over the first substrate 100 so as not to be consecutively disposed in one direction or in a direction perpendicular to the one direction. Accordingly, the first semiconductor integrated circuits 401 to the fourth semiconductor integrated circuits 404 are arranged alternately. A layer having the first semiconductor integrated circuits 401 to the fourth semiconductor integrated circuits 404 is a semiconductor integrated circuit layer. For example, in FIGS. 5A and 5B, each of the first semiconductor integrated circuits 401 to the fourth semiconductor integrated circuits 404 are arranged in a rough quadrangular region.

By a method as shown in Embodiment Mode 1, the first semiconductor integrated circuits 401 are transferred to a second substrate. In the same way, the second semiconductor integrated circuits 402 are transferred to a third substrate. The third semiconductor integrated circuits 403 are transferred to a fourth substrate. The fourth semiconductor integrated circuits 404 are transferred to a fifth substrate. Furthermore, the semiconductor integrated circuits 401 transferred to the second substrate are transferred to a sixth substrate 501; the second semiconductor integrated circuits 402 transferred to the third substrate are transferred to a seventh substrate 502; the third semiconductor integrated circuits transferred to the fourth substrate are transferred to an eighth substrate 503; and the fourth semiconductor integrated circuits 404 transferred to the fifth substrate are transferred to a ninth substrate 504.

A method for transferring the first semiconductor integrated circuits 401 to the fourth semiconductor integrated circuits 404 to the sixth substrate 501 to the ninth substrate 504, respectively will be explained in detail with reference to FIGS. 12A to 12F to FIGS. 15A to 15D.

Figure 12A:
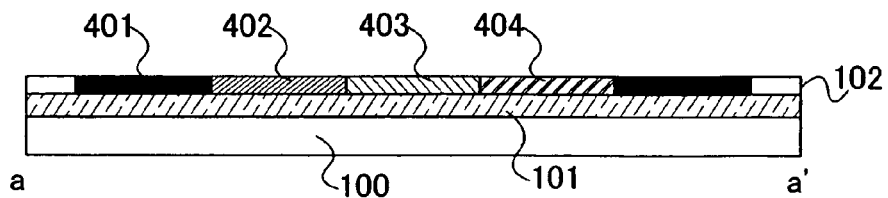
FIGS. 12A to 12F are views each showing a structure of Embodiment Mode 2.

A cross sectional view of a-a' in FIG. 5A is shown in FIG. 12A. As shown in FIG. 12A, the peeling layer 101 is formed over the first substrate 100. The first semiconductor integrated circuits 401 to the fourth semiconductor integrated circuits 404 are formed over the peeling layer 101. A layer having the first semiconductor integrated circuits 401 to the fourth semiconductor integrated circuits 404 is a semiconductor integrated circuit layer 102.

A semiconductor substrate such as a silicon wafer, a quartz substrate, a glass substrate, or the like can be used as the first substrate 100. By using a substrate having a high heat-resistance temperature as the first substrate 100, an allowable temperature for a process in manufacturing the first semiconductor integrated circuits 401 to the fourth semiconductor integrated circuits 404 can be increased. Accordingly, it becomes possible to perform sufficient heat treatment, thereby improving characteristics of the first semiconductor integrated circuits 401 to the fourth semiconductor integrated circuits 404. In addition, a substrate having rigidity can also be used as the first substrate 100. By using the substrate having rigidity as the first substrate 100, a distortion of the first substrate 100 can be reduced, and misalignment or the like in manufacturing the first semiconductor integrated circuits 401 to the fourth semiconductor integrated circuits 404 can be reduced. Accordingly, reliability of the first semiconductor integrated circuits 401 to the fourth semiconductor integrated circuits 404 can be improved.

Figure 12B:
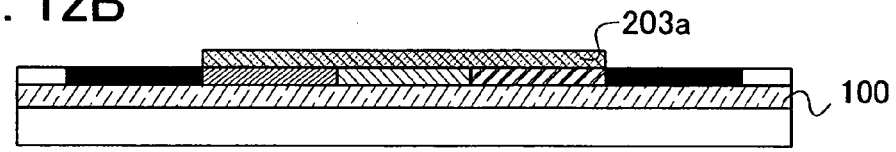

A first resin material is applied so as to cover the second semiconductor integrated circuits 402 to the fourth semiconductor integrated circuits 404. Thereafter, baking treatment is performed using heating means such as an oven, a hot plate, or a furnace to solidify the first resin material, and a first insulating layer 203a formed of a resin is formed (FIG. 12B). Here, a vinyl-based resin material (a resin material having a vinyl group) is used as the first resin material. For example, 503B-SH made by Asahi Chemical Research Laboratory can be used as the first resin material. A temperature of the baking treatment is greater than or equal to 130° C. and less than 150° C. When a baking treatment temperature is set to 130° C., the applied first resin material can be solidified by baking treatment for 10 minutes. It is to be noted that the first insulating layer 203a may have an insulating property to a direction parallel to the surface (top surface) of the first substrate 100 so that a plurality of semiconductor integrated circuits does not short-circuit. Consequently, the first insulating layer 203a may be formed using an anisotropic conductive material instead of the first resin material. The anisotropic conductive material has conductive particles mixed in an adhesive agent and has a conductive property in a direction perpendicular to the surface of the first substrate 100 and an insulating property in a direction parallel thereto.

Figure 12C:
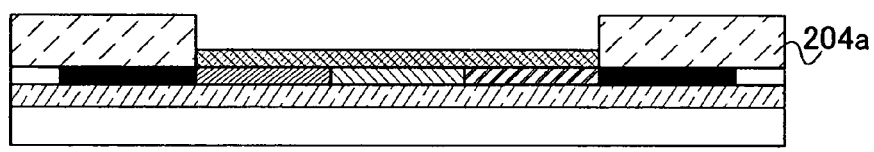
Figure 12D:
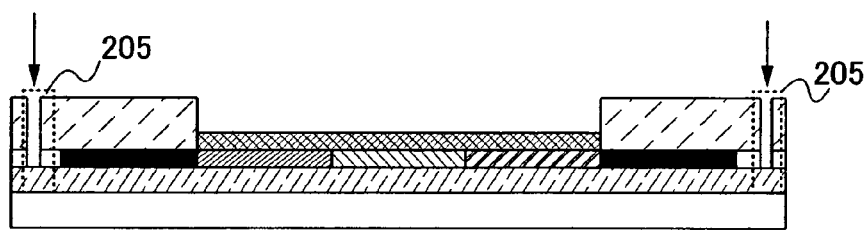

After the first insulating layer 203a is formed, a second resin material is applied so as to cover the first semiconductor integrated circuits 401. The second resin material differs from the first resin material. Thereafter, baking treatment is performed using heating means such as an oven, a hot plate, or a furnace to solidify the first resin material, and a second insulating layer 204a formed of a resin is formed (FIG. 12C). Here, as the second resin material, an epoxy-based resin material is used. As the second resin material, XN651 manufactured by Mitsui Chemicals can be used. A temperature of the baking treatment is greater than or equal to 140° C. and less than 180° C. When a baking treatment temperature is set to 160° C., the applied second resin material can be solidified by baking treatment for 30 minutes. It is to be noted that the second insulating layer 204a may have an insulating property to a direction parallel to the surface (top surface) of the first substrate so that a plurality of semiconductor integrated circuits does not short-circuit. Consequently, the first insulating layer 203a may be formed using an anisotropic conductive material instead of the first resin material. The anisotropic conductive material has conductive particles mixed in an adhesive agent and has a conductive property in a direction perpendicular to the surface of the first substrate 100 and an insulating property in a direction parallel thereto.

A printing method, a droplet discharge method, or the like can be employed as an application method of the resin material or the like for forming the first insulating layer 203a and the second insulating layer 204a.

In FIGS. 12A to 12F, a structure is shown in which the first insulating layer 203a and the second insulating layer 204a do not overlap with each other.

Next, an opening 205 is formed in the semiconductor integrated circuit layer 102, and the peeling layer 101 is exposed (FIG. 2C). It is preferable to provide the opening 205 in a region avoiding the first semiconductor integrated circuit 401 to the fourth semiconductor integrated circuit 404 constituting the semiconductor integrated circuit layer 102 or in an edge portion of the first substrate 100. Further, the opening 205 may also be provided in a boundary region between the semiconductor integrated circuits. The opening 205 can be formed by being irradiated with a laser beam, ground by a machine, or cut. Forming the opening 205 by laser beam irradiation is preferable because processing time can be shortened. When the opening 205 is provided by laser beam irradiation, by transferring an irradiated region of the laser beam, a shape of the opening 205 seen from a direction perpendicular to the top surface of the first substrate 100 can be an arbitrary shape. For example, the shape of the opening 205 seen from a direction perpendicular to the top surface of the first substrate 100 can be curved. For example, a UV laser can be used as a laser. The first substrate 100, the peeling layer 101, the semiconductor integrated circuit layer 102, and the second insulating layer 204a are irradiated with the laser beam. Also, the laser beam is emitted from the second insulating layer 204a side (a direction shown by an arrow in FIG. 2D). The opening 205 is formed so that at least part of the peeling layer 101 is exposed. Therefore, the opening 205 is provided in at least the semiconductor integrated circuit layer 102 and the second insulating layer 204a. It is to be noted that the laser beam may reach the first substrate 100. In other words, the opening 205 may be formed so as to penetrate the first substrate 100 or so as to remove part of the substrate 100.

Figure 12E:
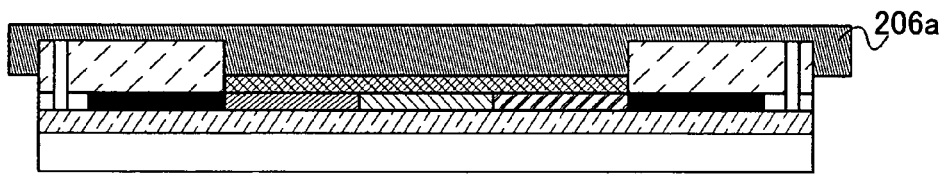

A second substrate 206a is provided over the second insulating layer 204a (FIG. 12E). The second substrate 206a is a substrate in which an insulating layer and an adhesive layer (may be a sticking layer) are stacked and is a thermal peeling substrate. The second substrate 206a is placed so that the adhesion layer and the second insulating layer 204a are attached to each other. The thermal peeling substrate has an adhesive layer of which adhesion force is weakened by heat treatment. As the adhesive layer, for example, a layer formed of a thermoplastic adhesive agent which gets soft in heating; a layer formed of a material where a microcapsule that expands by heating or a foaming agent is mixed in; a layer formed of a material where thermofusion or a pyrolytic property is given to a thermosetting resin; or a layer using material in which interface strength deteriorates due to penetration of moisture or using a resin which expands due to absorption of water can be used.

Figure 12F:
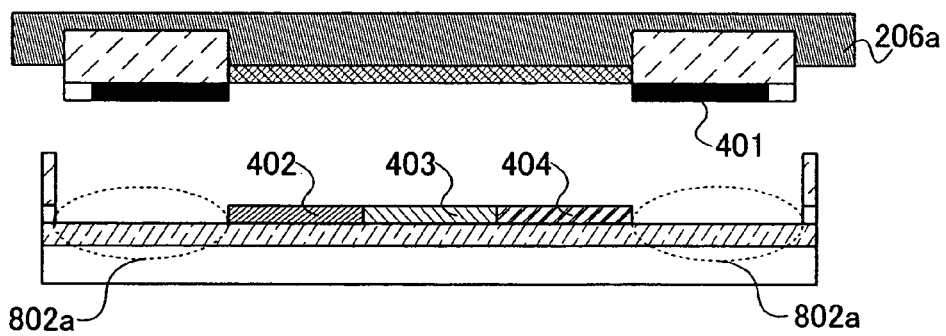

The first semiconductor integrated circuits 401 are separated from the first substrate 100 by using the second substrate 206a. At this time, an external force may be applied so that the second substrate 206a and the first substrate 100 are separated from each other. The first semiconductor integrated circuits 401 may be separated from the first substrate 100 by etching the peeling layer 101 by introducing a gas or a liquid through the opening 205. Alternatively, the first semiconductor integrated circuits 401 may be separated from the first substrate 100 by etching the peeling layer 101 by introducing a gas or a liquid through the opening 205 and further by applying an external force. For etching, for example, a gas or a liquid containing halogen fluoride or an interhalogen compound can be used. The separation of the first substrate 100 and the first semiconductor integrated circuits 401 is performed inside the peeling layer 101 or at a boundary between the peeling layer 101 and the semiconductor integrated circuit layer 102. Accordingly, the first semiconductor integrated circuits 201 are transferred to the second substrate 206a (FIG. 12F). A state of the first substrate 100 after the first semiconductor integrated circuits 401 are transferred to the second substrate 206a is shown in Column X1, Row a in FIG. 5B.

Figure 13A:
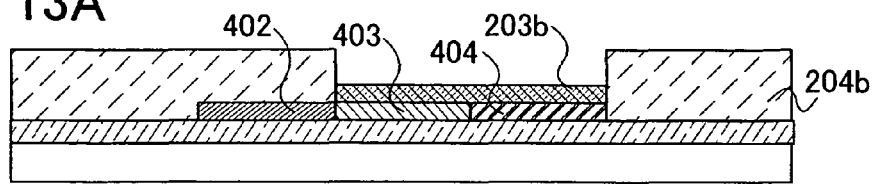
FIGS. 13A to 13F are views each showing a structure of Embodiment Mode 2.
Figure 13B:
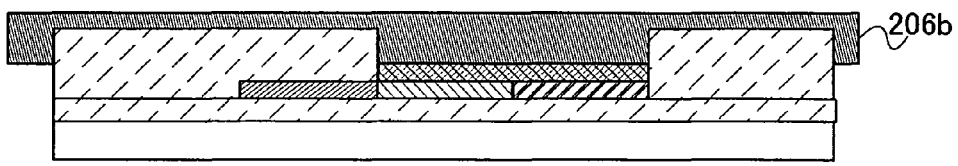
Figure 13C:
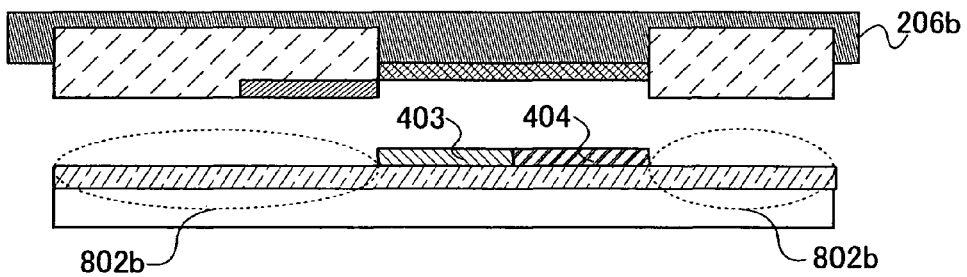

Next, a third resin material is applied over the third semiconductor integrated circuits 403 and the fourth semiconductor integrated circuits 404 remaining over the first substrate 100 and is baked, thereby forming a third insulating layer 203b formed of a resin. After the third insulating layer 203b is formed, a fourth resin material is applied so as to cover the second semiconductor integrated circuits 402. Thereafter, baking is performed, and a fourth insulating layer 204b formed of a resin is formed (FIG. 13A). The third resin material can be the same as the first resin material. The fourth resin material can be the same as the second resin material. Furthermore, as described above, an opening is provided by a laser beam or the like. A third substrate 206b is provided over the third insulating layer 203b and the fourth insulating layer 204b (FIG. 13B). The second semiconductor integrated circuits 402 are separated from the first substrate 100 by using the third substrate 206b. An external force may be applied so as to separate the third substrate 206b and the first substrate 100 from each other. As the third substrate 206b, the same material as that of the second substrate 206a can be used. Accordingly, the second semiconductor integrated circuits 402 are transferred to the third substrate 206b (FIG. 13C). A state of the first substrate 100 after the second semiconductor integrated circuits 402 are transferred to the third substrate 206b is shown in Column X2, Row a in FIG. 5B.

Figure 13D:
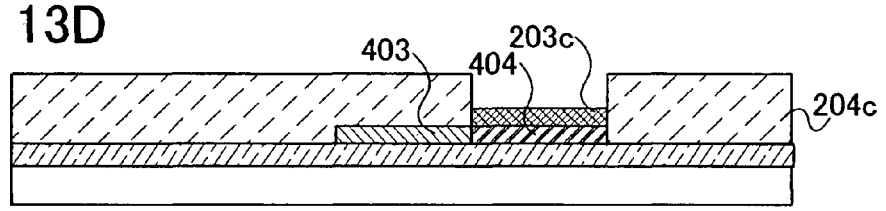
Figure 13E:
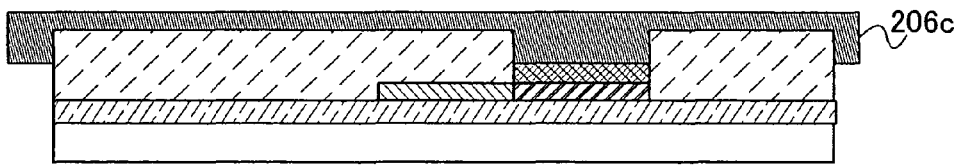
Figure 13F:
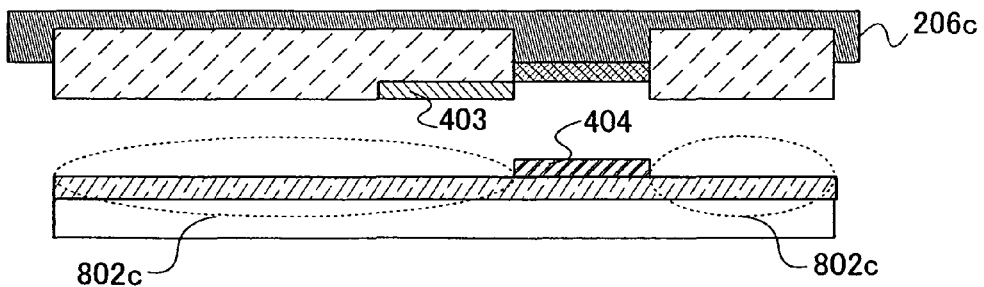

Next, a fifth resin material is applied over the fourth semiconductor integrated circuits 402 remaining over the first substrate 100 and is baked, thereby forming a fifth insulating layer 203c formed of a resin. After the fifth insulating layer 203c is formed, a sixth resin material is applied so as to cover the third semiconductor integrated circuits 403. Thereafter, baking is performed, and a sixth insulating layer 204c formed of a resin is formed (FIG. 13D). The fifth resin material can be the same as the first resin material and the third resin material. The sixth resin material can be the same as the second resin material and the fourth resin material. Furthermore, as described above, an opening is provided by a laser beam or the like. A fourth substrate 206c is formed over the fifth insulating layer 203c and the sixth insulating layer 204c (FIG. 13E). The third semiconductor integrated circuits 403 are separated from the first substrate 100 by using the fourth substrate 206c. An external force may be applied so as to separate the fourth substrate 206c and the first substrate 100 from each other. As the fourth substrate 206c, the same material as that of the second substrate 206a can be used. Accordingly, the third semiconductor integrated circuits 403 are transferred to the fourth substrate 206c (FIG. 13F). A state of the first substrate 100 after the third semiconductor integrated circuits 403 are transferred to the fourth substrate 206c is shown in Column X3, Row a in FIG. 5B.

Figure 14A:
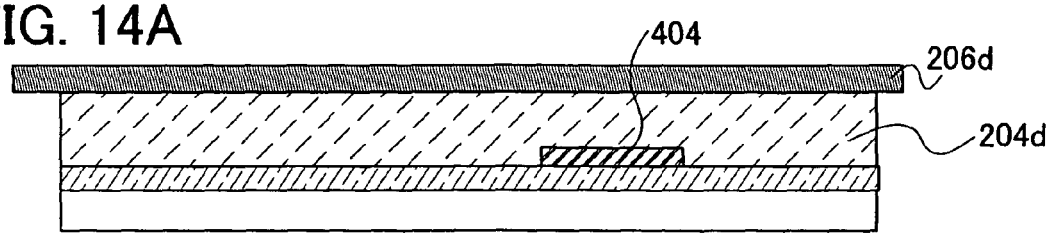
FIGS. 14A to 14F are views each showing a structure of Embodiment Mode 2.
Figure 14B:
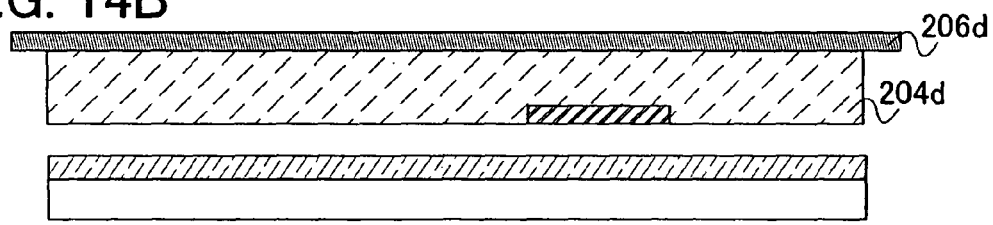

Next, a seventh resin material is applied over the fourth semiconductor integrated circuits 404 remaining over the first substrate 100 and is baked, thereby forming a seventh insulating layer 204d formed of a resin. The seventh resin material can be the same as the second resin material. Furthermore, as described above, an opening is provided by a laser beam or the like. A fifth substrate 206d is provided over the seventh insulating layer 204d (FIG. 14A). Then, the fourth semiconductor integrated circuits 404 are separated from the first substrate 100 by separating the first substrate 100 and the fifth substrate 206d from each other by applying an external force, that is, by using physical means. As the fifth substrate 206d, the same material as that of the second substrate 206a can be used. Accordingly, the fourth semiconductor integrated circuits 404 are transferred to the fifth substrate 206d (FIG. 14B). It is to be noted that the fourth semiconductor integrated circuits 404 can be separated by using the fifth substrate 206b which adheres to (sticks to) the fourth semiconductor integrated circuits 404, without forming the seventh insulating layer 204d. A state of the substrate 100 after the fourth semiconductor integrated circuits 404 are transferred to the fifth substrate 206d is shown in Column X4, Row a in FIG. 5B.

In the step shown in FIG. 12F, when the separation is performed inside the peeling layer 101, a surface of a region 802a of the peeling layer 101, which overlaps with the first semiconductor integrated circuit 401, is removed. In this case, when the fourth insulating layer 204b is formed over the region 802a in the step shown in FIG. 13A, it is sometimes difficult to separate the fourth insulating layer 204b from the first substrate 100 in the step shown in FIG. 13B. For this reason, after the step shown in FIG. 12F, treatment for weakening adhesion with the fourth insulating layer 204b is performed to the region 802a. As this treatment, a layer constituting the surface of the peeling layer 101 removed in the step shown in FIG. 12F may be manufactured again. Alternatively, instead of the treatment for weakening adhesion, after the step shown in FIG. 12F, the fourth insulating layer 204b may be formed in only a portion other than the region 802a in the step shown in FIG. 13A. In the same way, treatment for weakening adhesion may be performed to a region 802b shown in FIG. 13C, or the sixth insulating layer 204c may be formed in only a portion other than the region 802b. A treatment for weakening adhesion may be performed to a region 802c shown in FIG. 13F, or the seventh insulating layer 204d may be formed in only a portion other than the region 802c.

Figure 14C:
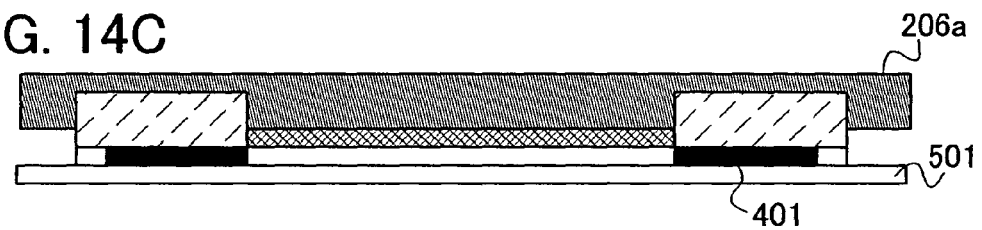
Figure 14D:
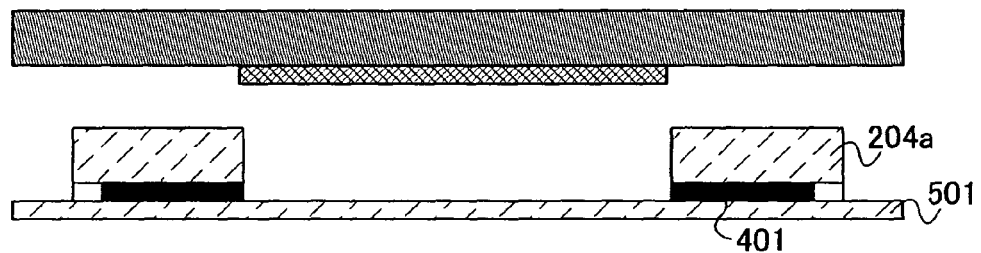
Figure 14E:
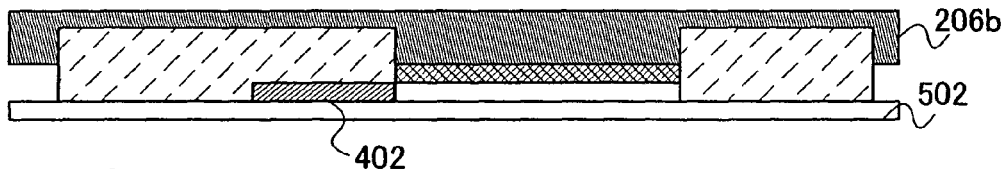
Figure 14F:
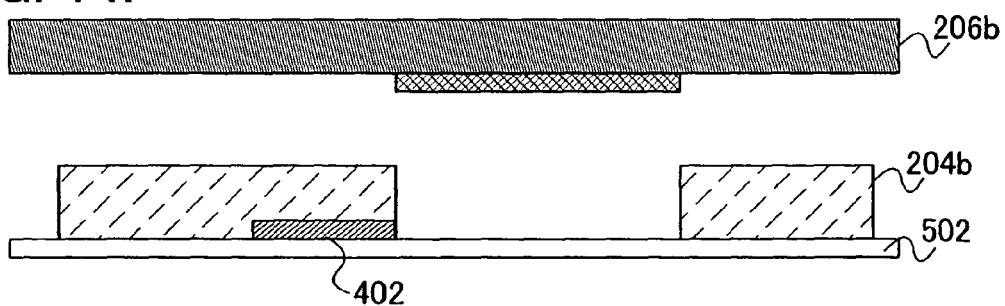
Figure 15A:
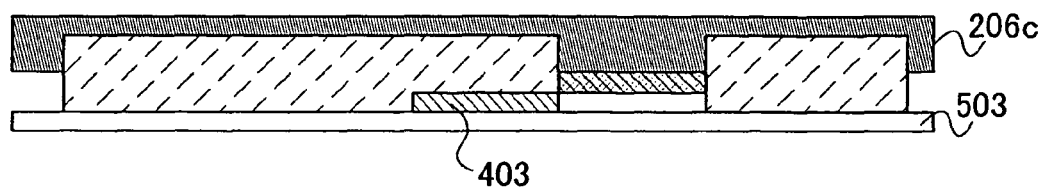
FIGS. 15A to 15D are views each showing a structure of Embodiment Mode 2.
Figure 15B:
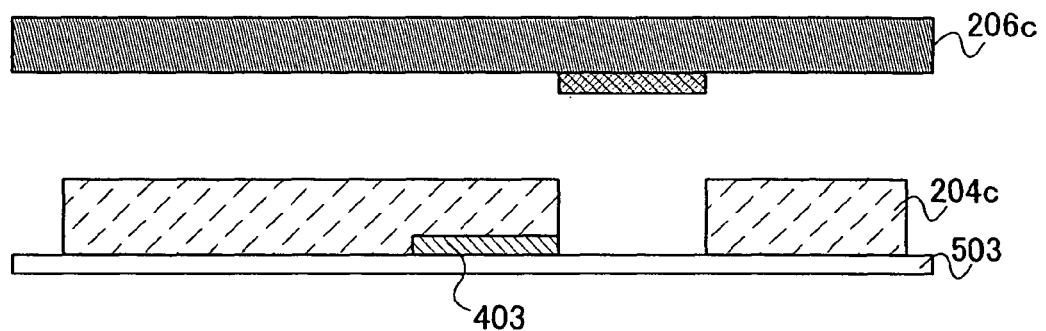
Figure 15C:
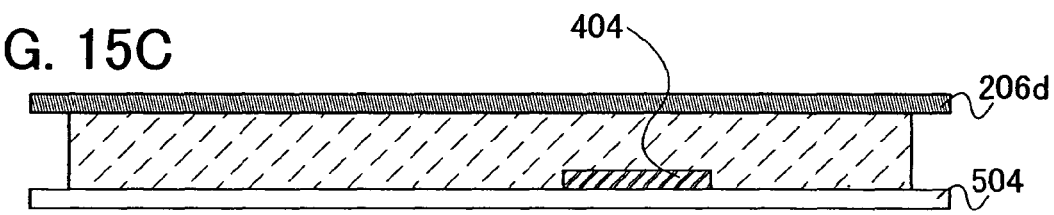
Figure 15D:
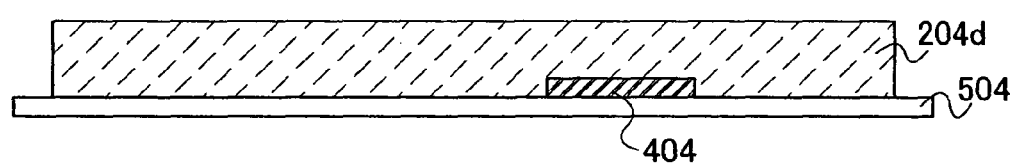

Subsequently, a sixth substrate 501 is provided over the surface of the first semiconductor integrated circuits 401 transferred to the second substrate 206a by the step shown in FIG. 12F (FIG. 14C). The first semiconductor integrated circuits 401 are separated from the second substrate 206a by heat treatment, and the first semiconductor integrated circuits 401 are transferred to the sixth substrate 501 (FIG. 14D). A state over the sixth substrate 501 at this time is shown in Column X1, Row b in FIG. 5B. In the same way, a seventh substrate 502 is provided over the surface of the semiconductor integrated circuits 402 transferred to the third substrate 206 by the step shown in FIG. 13C (FIG. 14E). The second semiconductor integrated circuits 402 are separated from the third substrate 206, and the second semiconductor integrated circuits 402 are transferred to the seventh substrate 502 (FIG. 14F). A state over the seventh semiconductor substrate 502 at this time is shown in Column X2, Row b in FIG. 5B. An eighth substrate 503 is provided over the surface of the third semiconductor integrated circuits 403 transferred to the fourth substrate 206c by the step shown in FIG. 15A). The third semiconductor integrated circuits 403 are separated from the fourth substrate 206c, and the third semiconductor integrated circuits 403 are transferred to the eighth substrate 503 (FIG. 15B). A state over the eighth substrate 503 at this time is shown in Column X3, Row b in FIG. 5B. A ninth substrate 504 is provided over the surface of the fourth semiconductor integrated circuits 404 transferred to the fifth substrate 206d by the step shown in FIG. 14B (FIG. 15C). The fourth semiconductor integrated circuits 404 are separated from the fifth substrate 206d, and the fourth semiconductor integrated circuits 404 are transferred to the ninth substrate 504 (FIG. 15D). A state over the ninth substrate at this time is shown in Column X4, Row b in FIG. 5B. Each of the sixth substrate 501 to the ninth substrate 504 is a substrate in which an insulating layer and an adhesive layer are stacked. The adhesive layer increases its adhesion force by heat treatment and corresponds to a layer containing a thermoplastic resin. The thermoplastic resin, for example, corresponds to polyethylene, polystyrene, polypropylene, polyvinyl chloride, or the like.

As shown by Row b in FIG. 5B, since, over the sixth substrate 501, each of the second semiconductor integrated circuits 402, each of the third semiconductor integrated circuits 403, and each of the fourth semiconductor integrated circuits 404 are not arranged to be adjacent to any of the first semiconductor integrated circuits 401, the first semiconductor integrated circuits 401 are arranged while keeping a distance from each other. Since, over the seventh substrate 502, each of the first semiconductor integrated circuits 401, each of the third semiconductor integrated circuits 403, and each of the fourth semiconductor integrated circuits 404 are not arranged to be adjacent to any of the second semiconductor integrated circuits 402, the second semiconductor integrated circuits 402 are arranged while keeping a distance from each other. Since, over the eighth substrate 503, each of the first semiconductor integrated circuits 401, each of the second semiconductor integrated circuits 402, and each of the fourth semiconductor integrated circuits 403 are not arranged to be adjacent to any of the third semiconductor integrated circuits 403, the third semiconductor integrated circuits 403 are arranged while keeping a distance from each other. Since, over the ninth substrate 504, each of the first semiconductor integrated circuits 401, each of the second semiconductor integrated circuits 402, and each of the third semiconductor integrated circuits 403 are not arranged to be adjacent to any of the fourth semiconductor integrated circuits 404, the fourth semiconductor integrated circuits 404 are arranged while keeping a distance from each other.

The sixth substrate 501 is divided so as to divide a plurality of first semiconductor integrated circuits 401 formed over the sixth substrate 501 into separate pieces. The division is performed along lines 213 almost going through the center between the first semiconductor integrated circuits 401 (Column X1, Row c in FIG. 5B). It is to be noted that the sixth substrate 501 may be divided at another position without being limited to the lines 213, as long as the first semiconductor integrated circuits 401 are not cut off. In the same way, the seventh substrate 502 is divided along lines 214 so as to divide a plurality of second semiconductor integrated circuits 402 formed over the seventh substrate 502 into separate pieces (Column X2, Row c in FIG. 5B). The eighth substrate 503 is divided along lines 215 so as to divide a plurality of third semiconductor integrated circuits 403 formed over the eighth substrate 503 into separate pieces (Column X3, Row c in FIG. 5B). The ninth substrate 504 is divided along lines 216 so as to divide a plurality of fourth semiconductor integrated circuits 404 formed over the ninth substrate 504 into separate pieces (Column X4, Row c in FIG. 5B). Accordingly, a plurality of semiconductor devices is manufactured.

Each of the sixth substrate 501 to the ninth substrate 504 can be divided by using a laser, a cutter, a pair of scissors, or the like. In addition, each of the sixth substrate 501 to the ninth substrate 504 can be divided by using a heated wire or the like. For example, a frame of a wire formed into a division shape of the semiconductor integrated circuit is heated and the frame is pushed through, thereby dividing each of the sixth substrate 501 to the ninth substrate 504.

If each of the sixth substrate 501 to the ninth substrate 504 is a flexible substrate, a semiconductor device having flexibility can be manufactured.

According to the present invention, four types of semiconductor integrated circuits (the first semiconductor integrated circuits 401 to the fourth semiconductor integrated circuits 404) that are arranged so that, over the first substrate 100, each of the first semiconductor integrated circuits 401, each of the second semiconductor integrated circuits 402, each of the third semiconductor integrated circuits 403, and each of the fourth semiconductor integrated circuits 404 are adjacent to each other can be transferred to additional substrates (the sixth substrate 501 to the ninth substrate 504) through multiple transfer operations. The first semiconductor integrated circuits 401 to the fourth semiconductor integrated circuits 404 formed over the first substrate are transferred to additional substrates (the sixth substrate 501 to the ninth substrate 504), respectively, and each of the first semiconductor integrated circuits 401 to the fourth semiconductor integrated circuits 404 are divided into separate pieces. Over each of the sixth substrate 501 to the ninth substrate 504, the semiconductor integrated circuits are arranged while keeping a distance from each other. Accordingly, a large division margin of each of the sixth substrate 501 to the ninth substrate 504 can be obtained. In addition, the number of semiconductor devices that can be manufactured from one first substrate can be increased.

With respect to the transfer method through two transfer operations shown in Embodiment Mode 1, in the method for manufacturing a semiconductor device by using a transfer method through four transfer operations shown in this embodiment, in each of the first semiconductor integrated circuits to the fourth semiconductor integrated circuits transferred to the substrate which differs from the first substrate, a plurality of semiconductor integrated circuits can be arranged while keeping a wide distance from each other Therefore, a larger division margin can be obtained. Accordingly, the number of semiconductor devices that can be manufactured from one first substrate can be increased.

By forming the second insulating layer 204a so as not to cover an edge portion of the first insulating layer 203a, it is possible for the first insulating layer 203a not to remain between the second insulating layer 204a and the first semiconductor integrated circuit 401. By forming the fourth insulating layer 204b so as not to cover an edge portion of the third insulating layer 203b, it is possible for the third insulating layer 203b not to remain between the fourth insulating layer 204b and the second semiconductor integrated circuit 402. By forming the sixth insulating layer 204c so as not to cover an edge portion of the fifth insulating layer 203c, it is possible for the fifth insulating layer 203c not to remain between the sixth insulating layer 204c and the third semiconductor integrated circuit 403. Accordingly, adhesion between the second insulating layer 204a and the first semiconductor integrated circuit 401, adhesion between the fourth insulating layer 204b and the second semiconductor integrated circuit 402, and adhesion between the sixth insulating layer 204c and the third semiconductor integrated circuit 403 can be enhanced, and reliability of the semiconductor device can be further improved. In addition, after each of the first semiconductor integrated circuits 401, the second semiconductor integrated circuits 402, and the third semiconductor integrated circuits 403 are transferred to the substrate which differs from the first substrate 100, the first insulating layer 203a, the third insulating layer 203b, and the fifth insulating layer 203c can be easily removed.

In this embodiment mode, a structure is shown in which, after the first semiconductor integrated circuits 401 transferred to the second substrate 206a are transferred to the sixth substrate 501, the sixth substrate 501 is divided so that the first semiconductor integrated circuits 401 are divided into separate pieces. However, the present invention is not limited thereto. A structure may also be employed in which, after the first semiconductor integrated circuits 401 are transferred to the second substrate 206a, the second substrate 206a is divided so that the first semiconductor integrated circuits 401 are divided into separate pieces. In the same way, a structure may be employed in which, after the second semiconductor integrated circuits 402 are transferred to the third substrate 206b, the third substrate 206b is divided so that the second semiconductor integrated circuits 402 are divided into separate pieces. In the same way, a structure may be employed in which, after the third semiconductor integrated circuits 403 are transferred to the fourth substrate 206c, the fourth substrate 206c is divided so that the third semiconductor integrated circuits 403 are divided into separate pieces. In the same way, a structure may be employed in which, after the fourth semiconductor integrated circuits 404 are transferred to the fifth substrate 206d, the fifth substrate 206d is divided so that the fourth semiconductor integrated circuits 404 are divided into separate pieces. Accordingly, a plurality of semiconductor devices is manufactured. If each of the second substrate 206a to the fifth substrate 206d is a flexible substrate, a semiconductor device having flexibility can be manufactured.

Although the structure is shown in this embodiment mode, in which division is performed so that the semiconductor integrated circuits are divided into separate pieces, the present invention is not limited thereto. The semiconductor integrated circuits may be divided into groups of semiconductor integrated circuits depending on the intended purpose of the semiconductor device. For example, division into a form in which a plurality of semiconductor integrated circuits aligns while keeping a distance from each other may be performed. Since a plurality of semiconductor integrated circuits is connected through a substrate in a structure in which the plurality of semiconductor integrated circuits aligns, it is possible to easily manufacture a semiconductor device having a structure in which the plurality of semiconductor integrated circuits is electrically connected to each other in series or in parallel. Also, a plurality of semiconductor integrated circuits is shipped in a state of being connected through a substrate, and thereafter, the plurality of semiconductor circuits may be further divided into separate pieces to be used. In a state where a plurality of semiconductor integrated circuits is connected to each other through the substrate, connection of the plurality of semiconductor integrated circuits and a plurality of elements can be performed collectively. For example, connection of the plurality of semiconductor integrated circuits with the plurality of elements or the like can be performed by using a roll-to-roll method. Therefore, efficiency of mass production of the semiconductor device can be improved.

Accordingly, a method for manufacturing a highly reliable semiconductor device at low cost can be provided.

This embodiment mode can be implemented by being freely combined with Embodiment Mode 1.

Embodiment Mode 3

Figures 6A, 6B:
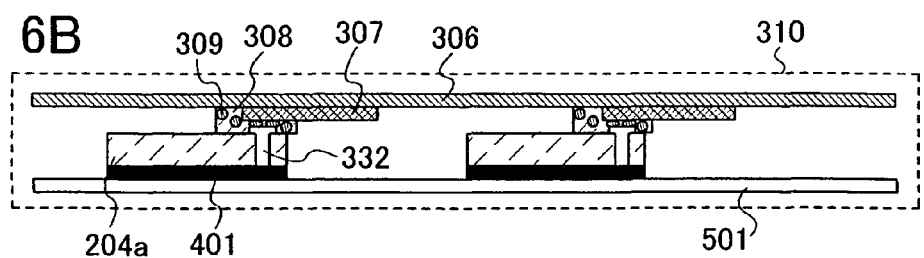
FIGS. 6A and 6B are views each showing a structure of Embodiment Mode 3.

In this embodiment mode, an example is shown in which the method for manufacturing a semiconductor device shown in Embodiment Mode 2 is applied to a method for manufacturing a semiconductor device which inputs and outputs data by wireless communication. FIGS. 6A and 6B are used for the explanation. The semiconductor device which inputs and outputs data by wireless communication is referred to as an RFID tag, an IC tag, an ID tag, a transponder, an IC chip, an ID chip, or the like. The semiconductor device which inputs and outputs data by wireless communication (hereinafter, referred to as an RFID tag) has an antenna, and inputs and outputs data by wireless communication through the antenna.

In FIGS. 6A and 6B, steps up to Row b in FIG. 6A are the same as the steps up to Rows b in FIG. 5B; therefore, the explanation thereof is omitted.

As shown in Row c in FIG. 6A, a tenth substrate 306 provided with a plurality of conductive layers 307 serving as an antenna of an RFID tag is prepared. The conductive layers 307 serving as an antenna are provided while keeping a distance from each other. The conductive layer 307 serving as an antenna can be an arbitrary shape such as a coiled shape or a dipole shape. The distance between the conductive layers 307 corresponds to a distance between first semiconductor integrated circuits 401 over a substrate 100, a distance between second semiconductor integrated circuits 402 over the first substrate 100, a distance between third semiconductor integrated circuits 403 over the first substrate 100, and a distance between fourth semiconductor integrated circuits 404 over the first substrate 100. The conductive layer 307 can be formed by a printing method, a droplet discharge method, or the like.

Methods for electrically connecting the conductive layer 307 serving as an antenna with the semiconductor circuit and forming the RFID tag will be explained. In the explanation, a method for electrically connecting the conductive layer 307 serving as an antenna with the first semiconductor integrated circuit 401 is shown. It is to be noted that since a method for electrically connecting the conductive layer 307 serving as an antenna with each of the second semiconductor integrated circuit to the fourth semiconductor integrated circuit is the same as the method for electrically connecting the conductive layer 307 serving as the antenna with the first semiconductor integrated circuit 401, the explanation thereof is omitted.

An electrode 332 is provided so as to be electrically connected to an element (for example, a thin film transistor) included in the first semiconductor integrated circuit 401 (FIG. 6B). The electrode 332 is electrically connected to the element included in the first semiconductor integrated circuit 401 through a contact hole provided in a second insulating layer 204a. The electrode 332 can be provided by a sputtering method, a printing method, or the like. When the sputtering method is used, a metal film such as an aluminum film can be used. When the screen printing method is used, conductive metal paste (for example, silver paste) can be used. It is to be noted that the contact hole in the second insulating layer 204a and the electrode 332 can be formed after transferring the first semiconductor integrated circuit 401 to a sixth substrate 501 or after forming the second insulating layer 204a and before providing a second substrate 206a.

Next, the sixth substrate 501 and a tenth substrate 306 are attached to each other. The positional relationship between the first semiconductor integrated circuit 401 and the conductive layer 307 when the sixth substrate 501 and the tenth substrate 306 are attached to each other is shown in Row d in FIG. 6A. At this time, as shown in FIG. 6B, the electrode 332 and the conductive layer 307 over the tenth substrate 306 are attached to each other, having an anisotropic conductive material 308 therebetween. The anisotropic conductive material 308 is a material where conductive particles 309 are mixed into an adhesive agent, which is called ACP (anisotropic conductive paste) or a material where conductive particles are mixed into an adhesive sheet, which is called ACF (anisotropic conductive film). Subsequently, if necessary, one or both of pressure treatment and heat treatment are performed by using a flip chip bonder, a die bonder, an ACF bonder, a pressure bonder, or the like, and the sixth substrate 501 and the tenth substrate 306 are attached to each other, thereby forming a substrate 310.

After the sixth substrate 501 and the tenth substrate 306 are attached to each other, the attached substrate 310 is divided so that a plurality of first semiconductor integrated circuits 401 formed over the sixth substrate is divided into separate pieces. Accordingly, the semiconductor device can be manufactured.

According to this embodiment mode, four types of the semiconductor integrated circuits (the first semiconductor integrated circuits 401 to the fourth semiconductor integrated circuits 404) that are arranged so that, over the first substrate 100, each of the first semiconductor integrated circuits 401, each of the second semiconductor integrated circuits 402, each of the third semiconductor integrated circuits 403, and each of the fourth semiconductor integrated circuits 404 are adjacent to each other can be transferred to additional substrates (the sixth substrate 501 to the ninth substrate 504) through multiple transfer operations. After the semiconductor integrated circuits 401 to the fourth semiconductor integrated circuits 404 formed over the first substrate 100 are transferred to the additional substrates (the sixth substrate 501 to the ninth substrate 504) respectively, each of the first semiconductor integrated circuits 401 to the fourth semiconductor integrated circuits 404 are divided into separate pieces. The semiconductor integrated circuits are arranged while keeping a distance from each other over each of the sixth substrate 501 to the ninth substrate 504. Accordingly, a large division margin of each of the sixth substrate 501 to the ninth substrate 504 can be obtained. In addition, the number of semiconductor devices that can be manufactured from one first substrate 100 can be increased.

The semiconductor integrated circuits are arranged while keeping a distance from each other over each of the sixth substrate 501 to the ninth substrate 504. Therefore, even if the conductive layer 307 serving as an antenna occupies a large area over the tenth substrate 306, the tenth substrate 306 can be attached to each of the sixth substrate 501 to the ninth substrate 504 so that one semiconductor integrated circuit corresponds to one conductive layer 307. In other words, the tenth substrate 306 can be attached to each of the sixth substrate 501 to the ninth substrate 504 so that the plurality of semiconductor devices does not overlap with one conductive layer 307. Accordingly, the number of semiconductor devices that can be manufactured from one first substrate 100 can be increased.

Consequently, a method for manufacturing a highly reliable semiconductor device at low cost can be provided.

This embodiment mode can be implemented by being freely combined with Embodiment Modes 1 and 2.

Embodiment Mode 4

In Embodiment Modes 1 to 3, the case where a plurality of semiconductor integrated circuits with the same size is formed over the first substrate 100 is explained. However, the present invention is not limited thereto. The semiconductor integrated circuits formed over the first substrate 100 can be various sizes. In addition, the semiconductor integrated circuits formed over the first substrate 100 can have different structures from each other. An example in which a plurality of semiconductor integrated circuits with different sizes is formed over one first substrate 100 will be explained with reference to FIGS. 7A and 7B.

As shown in FIG. 7A, second semiconductor integrated circuits 552 are arranged so as to occupy a large area over a first substrate 100. First semiconductor integrated circuits 551 and third semiconductor integrated circuits 553 that occupy a small area are arranged in the rest of the space.

The first semiconductor integrated circuits 551 are transferred to a substrate 554 by the method as shown in Embodiment Mode 1 or 2. A state of the substrate 554 over which the first semiconductor integrated circuits 551 are transferred is shown in Column X1, Row b in FIG. 7B. A state of the substrate 100 after the first semiconductor integrated circuits 551 are transferred therefrom is shown in Column X1, Row a in FIG. 7B. In the same way, the second semiconductor integrated circuits 552 are transferred to a substrate 555. A state of the substrate 555 to which the second semiconductor integrated circuits 552 are transferred is shown in Column X2, Row b in FIG. 7B. A state of the substrate 100 after the second semiconductor integrated circuits 552 are transferred therefrom is shown in Column X2, Row a. The third semiconductor integrated circuits 553 are transferred to a substrate 556. A state of the substrate 556 to which the third semiconductor integrated circuits 553 are transferred is shown in Column X3, Row a in FIG. 7B. A state of the first substrate 100 after the third semiconductor integrated circuits 553 are transferred therefrom is shown in Column X3, Row a in FIG. 7B. Each of the substrate 554 to the substrate 556 is divided so that the semiconductor integrated circuits are divided into separate pieces, and a semiconductor device can be manufactured. Each of the substrate 554 to the substrate 556 may be different from each other or the same.

According to this embodiment mode, multiple types of semiconductor integrated circuits manufactured over the first substrate 100 can be transferred to separate substrates. Since the substrate to which the semiconductor integrated circuits are transferred can be selected, a substrate which is suitable for each of the semiconductor integrated circuits having different structures can be selected. Accordingly, reliability of the semiconductor integrated circuit can be improved. When semiconductor integrated circuits with one size is formed over the first substrate 100, a space over the first substrate 100 where the first semiconductor integrated circuits are not arranged is generated in view of the size of the first substrate 100. However, by manufacturing multiple types of semiconductor integrated circuits with different sizes over the first substrate 100, the first substrate 100 can be effectively used. Accordingly, the number of semiconductor devices that can be manufactured from one first substrate 100 can be further increased.

Consequently, a method for manufacturing a highly reliable semiconductor device at low cost can be provided.

In addition, the present invention is not limited to the cases of using the transfer method through two transfer operations, the transfer method through three transfer operations, and the transfer method through four transfer operations. The semiconductor device can be manufactured by using a transfer method through arbitrary time transfer method.

This embodiment mode can be implemented by being freely combined with Embodiment Modes 1 to 3.

Embodiment Mode 5

In this embodiment mode, a method for forming semiconductor integrated circuits over a first substrate 100 will be explained. FIGS. 8A to 8D and FIGS. 9A and 9B are used for the explanation.

Figure 8A:
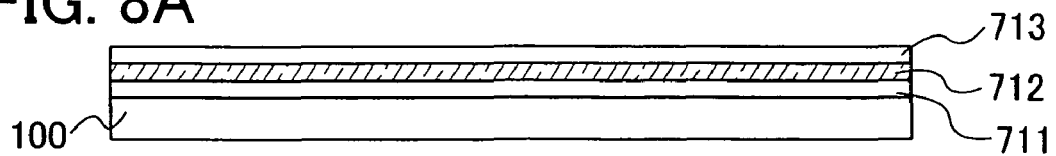
FIGS. 8A to 8D are views each showing a structure of Embodiment Mode 5.

As shown in FIG. 8A, an insulating layer 711, a peeling layer 712, and an insulating layer 713 are formed over the first substrate 100. The insulating layer 711, the peeling layer 712, and the insulating layer 713 correspond to the peeling layer 101 in FIGS. 1A and 1B to FIGS. 3A to 3F and FIGS. 12A to 12F to FIGS. 15A to 15D. As the first substrate 100, a glass substrate such as a barium borosilicate glass substrate or an alumino borosilicate glass substrate, a quartz substrate, a ceramic substrate, or the like can be used. Moreover, a semiconductor substrate over which an insulating film is formed may be used as well. A substrate formed of a synthetic resin having flexibility such as plastic may also be used. The surface of the first substrate 100 may be planarized by being polished by a CMP (chemical mechanical polishing) method or the like. As the insulating layer 711 and the insulating layer 713, oxide of silicon, nitride of silicon, oxide of silicon containing nitrogen, nitride of silicon containing oxygen, or the like that are formed by a chemical vapor deposition method (CVD method) or a sputtering method can be used. As the peeling layer 712, a layer containing an element selected from W, Mo, Ti, Ta, Nb, Ni, Co, Zr, Zn, Ru, Rh, Pd, Os, Ir, Si, or the like, an alloy or a compound material containing the elements as its main component is formed as a single layer or a stacked layer by a sputtering method or the like. It is to be noted that a layer containing silicon may be any of amorphous, microcrystalline, and polycrystalline.

When the peeling layer 712 has a single layer structure, preferably, a layer containing any of W, Mo, a mixture of W and Mo, oxide of W, nitride oxide of W, oxide of Mo, nitride oxide of Mo, oxide of a mixture of W and Mo, and nitride oxide of a mixture of W and Mo can be used.

When the peeling layer 712 has a stacked layer structure including two layers, preferably, a layer containing any of W, Mo, and a mixture of W and Mo can be used as a first layer, and a layer containing any of oxide of W, nitride oxide of W, oxide of Mo, nitride oxide of Mo, oxide of a mixture of W and Mo, and nitride oxide of a mixture of W and Mo can be used as a second layer. The surface of the first layer is processed by oxygen plasma treatment or $N_2O$ plasma treatment, thereby forming these oxide and nitride oxide.

Figure 8B:
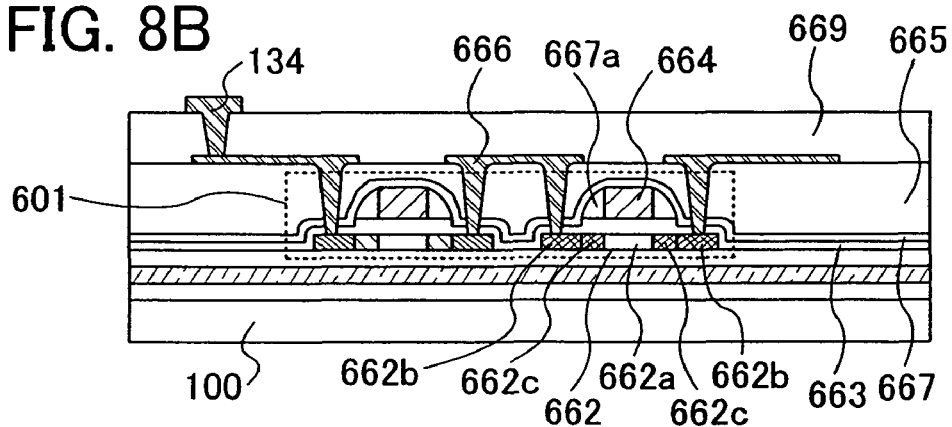

Next, as shown in FIG. 8B, a semiconductor layer 662 is formed over the insulating layer 713, and an element group 601 is formed.

As the semiconductor layer 662, an island-shaped crystalline semiconductor film or amorphous semiconductor film can be used. In addition, an organic semiconductor film may also be used. The crystalline semiconductor film can be obtained by crystallizing the amorphous semiconductor film. As a crystallization method, a laser crystallization method, a thermal crystallization method using RTA or furnace annealing, a thermal crystallization method using a crystallization-promoting metal element, or the like can be used. The semiconductor layer 662 has a channel formation region 662a and a pair of impurity regions 662b to which an impurity element imparting a conductivity type is added. Although a structure is shown in which each of low concentration impurity regions 662c to which the impurity element is added at lower concentration than the impurity regions 662b is provided between the channel formation region 662a and one of the pair of impurity regions 662b, the present invention is not limited thereto. A structure may also be employed in which the low concentration impurity region 662c is not provided. Alternatively, a structure may be employed in which silicide is formed over part of the top surface of the pair of impurity regions 662b (especially, a portion which is in contact with a wiring 666) or the entire surface thereof.

Figure 9A:
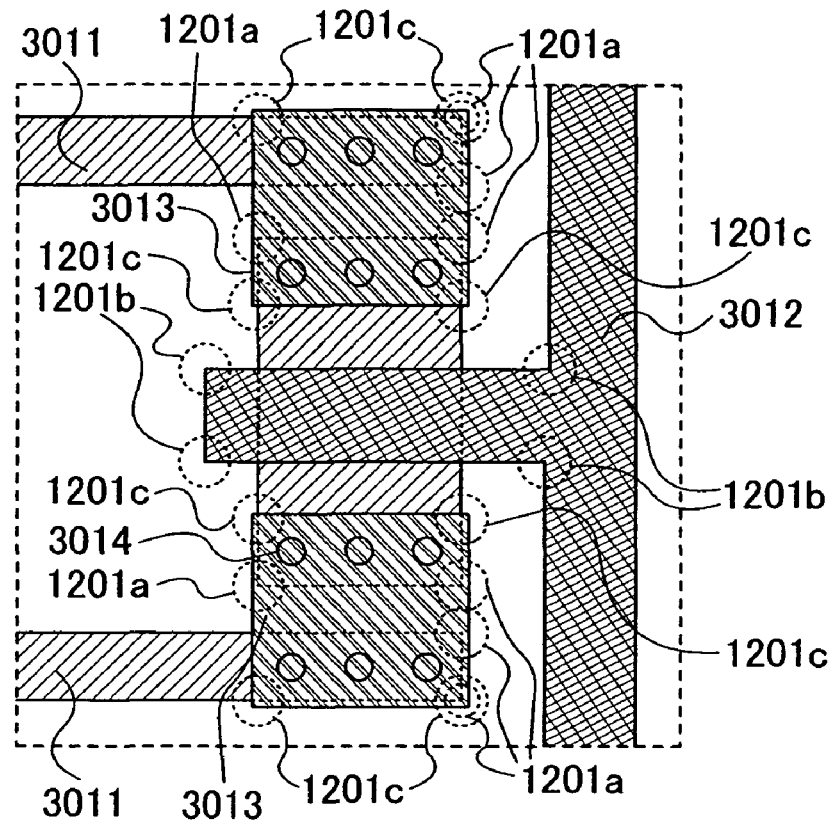
FIGS. 9A and 9B are views each showing a structure of Embodiment Mode 5.
Figure 9B:
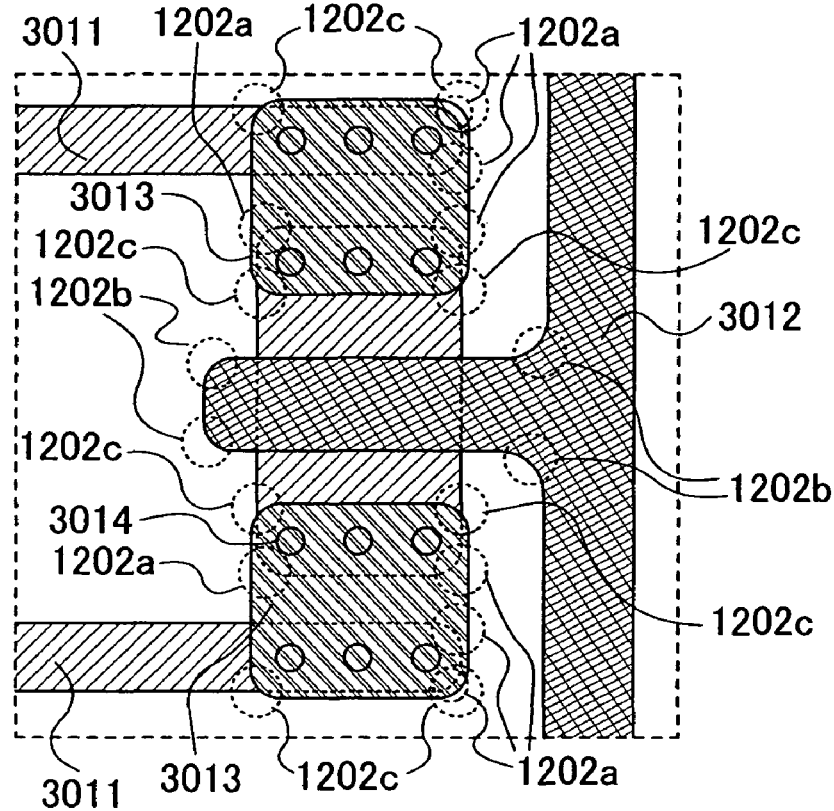

It is preferable that a wiring formed concurrently with (by the same step as) the semiconductor layer 662 be led so that corners are rounded when seen from a direction perpendicular to the top surface of the first substrate 100. FIGS. 9A and 9B are schematic views each showing a method for leading a wiring. The wiring formed concurrently with (by the same step as) the semiconductor layer is denoted by a wiring 3011. FIG. 9A shows a conventional method for leading a wiring. FIG. 9B shows a method for leading a wiring of the present invention. Corners 1202a are rounded in comparison with corners 1201a of the conventional wiring. By making the corners round, dust or the like can be prevented from remaining at the corners of the wiring. As a result, defects of a semiconductor device caused by dust can be reduced and the yield can be improved.

An impurity element imparting a conductivity type may be added to the channel formation region 662a of a thin film transistor. As a result, threshold voltage of the thin film transistor can be controlled.

A first insulating layer 663 is formed over the semiconductor layer 662. The first insulating layer 663 can be formed of a single layer or a stacked layer including a plurality of films using silicon oxide, silicon nitride, silicon nitride oxide, or the like. In this case, the surface of the first insulating layer 663 may be processed by high-density plasma treatment in an oxygen atmosphere or a nitrogen atmosphere, and may be processed by oxidation treatment or nitriding treatment to be densified. As described above, high-density plasma is generated by using a high frequency wave, for example, 2.45 GHz. It is to be noted that high-density plasma with an electron density within the range of $10^{11}$ to $10^{13}/cm^3$, an electron temperature of less than or equal to 2 eV, and an ion energy of less than or equal to 5 eV is used. Plasma can be generated using a plasma treatment apparatus utilizing high frequency excitation, which employs a radial slot antenna. In the apparatus for generating high-density plasma, the distance between the antenna which generates a high frequency wave and the first substrate 100 is within the range of 20 to 80 mm (preferably, 20 to 60 mm).

Before forming the first insulating layer 663, the above high-density plasma treatment may be applied to the surface of the semiconductor layer 662 so that the surface of the semiconductor layer 662 is oxidized or nitrided. At this time, by performing the treatment in an oxygen atmosphere or a nitrogen atmosphere with the first substrate 100 at a temperature within the range of 300 to 450° C., a favorable interface with the first insulating layer 663 that is formed over the semiconductor layer 662 can be formed.

As the nitrogen atmosphere, an atmosphere containing nitrogen (N) and a rare gas (containing at least one of He, Ne, Ar, Kr, and Xe), an atmosphere containing nitrogen, hydrogen (H), and a rare gas, or an atmosphere containing ammonia ($NH_3$) and a rare gas can be used. As the oxygen atmosphere, an atmosphere containing oxygen (O) and a rare gas, an atmosphere containing oxygen, hydrogen (H), and a rare gas, or an atmosphere containing dinitrogen monoxide (N₂O) and a rare gas can be used.

A gate electrode 664 is formed over the first insulating layer 663. As the gate electrode 664, an element selected from Ta, W, Ti, Mo, Al, Cu, Cr, and Nd, or an alloy or a compound containing a plurality of above elements can be used. In addition, the gate electrode 664 may have a single layer structure or a stacked layer structure including these elements, the alloy, or the compound. In the drawings, the gate electrode 664 having a single layer structure is shown. It is preferable that the gate electrode 664 or a wiring formed concurrently with (by the same step as) the gate electrode 664 be led so that corners are rounded when seen from a direction perpendicular to the top surface of the first substrate 100. A method for leading the wiring is the same as that shown in FIG. 9B. The gate electrode 664 or the wiring formed concurrently with (by the same step as) the gate electrode 664 is denoted by a wiring 3012. By making corners 1202b round in comparison with corners 1201b, dust or the like can be prevented from remaining at the corners of the wiring. As a result, defects of a semiconductor device caused by dust can be reduced and the yield can be improved.

The thin film transistor includes the semiconductor layer 662, the gate electrode 664, the first insulating layer 663 serving as a gate insulating film between the semiconductor layer 662 and the gate electrode 664. Although the thin film transistor is a top gate transistor in this embodiment mode, it may be a bottom gate transistor having a gate electrode below the semiconductor layer, or a dual gate transistor having gate electrodes above and below the semiconductor layer.

An insulating film (denoted by a sidewall 667a in FIGS. 8A to 8D) is provided so as to be in contact with the side face of the gate electrode 664. By adding an impurity element imparting a conductivity type to the semiconductor layer 662 after forming the sidewall 667a, the low concentration impurity region 662c can be formed in a self-aligning manner. In addition, a structure in which silicide is formed in the pair of impurity regions 662b may be formed in a self-aligning manner by using the sidewall 667a. It is to be noted that, although a structure in which the sidewall 667a is provided is shown, without being limited thereto, the sidewall may not be formed.

A second insulating layer 667 is formed over the gate electrode 664 and the sidewall 667a. It is desirable that the second insulating layer 667 be an insulating film such as a silicon nitride film, with a barrier property for blocking an ionic impurity. For example, the second insulating layer 667 is formed of silicon nitride or silicon oxynitride. This second insulating layer 667 serves as a protective film for preventing contamination of the semiconductor layer 662. After depositing the second insulating layer 667, a hydrogen gas may be introduced and the above-described high-density plasma treatment may be performed, thereby hydrogenating the second insulating layer 667. Alternatively, the second insulating layer 667 may be nitrided and hydrogenated by introducing an ammonia (NH₃) gas. Otherwise, oxidization-nitridation treatment and hydrogenation treatment may be performed by introducing oxygen, a dinitrogen monoxide (N₂O) gas, or the like with a hydrogen gas. By performing nitridation treatment, oxidization treatment, or oxidization-nitridation treatment in this manner, the surface of the second insulating layer 667 can be densified. Accordingly, the function of the second insulating layer 667 as a protective film can be enhanced. Hydrogen introduced into the second insulating layer 667 is discharged when thermal treatment is applied at a temperature within the range of 400 to 450° C., thereby hydrogenating the semiconductor layer 662. It is to be noted that the hydrogenation treatment may be performed in combination with hydrogenation treatment using the first insulating layer 663.

A third insulating layer 665 is formed over the second insulating layer 667. The third insulating layer 665 can have a single layer structure or a stacked layer structure of an inorganic insulating film or an organic insulating film. As the inorganic insulating film, a silicon oxide film formed by a CVD method, a silicon oxide film formed by an SOG (spin on glass) method, or the like can be used. As the organic insulating film, a film of polyimide, polyamide, BCB (benzocyclobutene), acrylic, a positive photosensitive organic resin, a negative photosensitive organic resin, or the like can be used.

The third insulating layer 665 may be made of a material having a skeleton structure formed of a bond of silicon (Si) and oxygen (O). An organic group containing at least hydrogen (such as an alkyl group and aromatic hydrocarbon) is used as a substituent of this material. Alternatively, a fluoro group may be used as the substituent. Further alternatively, a fluoro group and an organic group containing at least hydrogen may be used as the substituent.

The wiring 666 is formed over the third insulating layer 665. The wiring 666 can be formed of one element selected from Al, Ni, W, Mo, Ti, Pt, Cu, Ta, Au, and Mn, or an alloy containing a plurality of above elements. Alternatively, a single layer or a stacked layer of these elements or the alloy can be used. In the drawings, an example of a single layer structure is shown. It is to be noted that the wiring 666 is preferably led so that corners thereof are round when seen from a direction perpendicular to the top surface of the first substrate 100. A method for leading the wiring is the same as that shown in FIG. 9B. The wiring 666 is denoted by a wiring 3013. By making corners round, as in the corners 1202c, in comparison with the corners 1201c, dust or the like can be prevented from remaining at the corners of the wiring. As a result, defects of a semiconductor device due to dust can be reduced and the yield can be improved. The wiring 3013 is connected to the wiring 3011 through a contact hole 3014. The wiring 666 becomes a wiring to be connected to a source or a drain of the thin film transistor.

A fourth insulating layer 669 is formed over the wiring 666. The fourth insulating layer 669 can have a single layer structure or a stacked layer structure of an inorganic insulating film or an organic insulating film. As the inorganic insulating film, a silicon oxide film formed by a CVD method, a silicon oxide film formed by an SOG (spin on glass) method, or the like can be used. As the organic insulating film, a film of polyimide, polyamide, BCB (benzocyclobutene), acrylic, a positive photosensitive organic resin, a negative photosensitive organic resin, or the like can be used.

The fourth insulating layer 669 may be made of a material having a skeleton structure formed of a bond of silicon (Si) and oxygen (O). An organic group containing at least hydrogen (such as an alkyl group and aromatic hydrocarbon) is used as a substituent of this material. Alternatively, a fluoro group may be used as the substituent. Further alternatively, a fluoro group and an organic group containing at least hydrogen may be used as the substituent.

An electrode 134 is formed over the fourth insulating layer 669. The electrode 134 can be formed of one element selected from Al, Ni, W, Mo, Ti, Pt, Cu, Ta, Au, and Mn, or an alloy containing a plurality of above elements. Alternatively, a single layer or a stacked layer of these elements or the alloy can be used. In the drawings, an example of a single layer structure is shown.

Figure 8C:
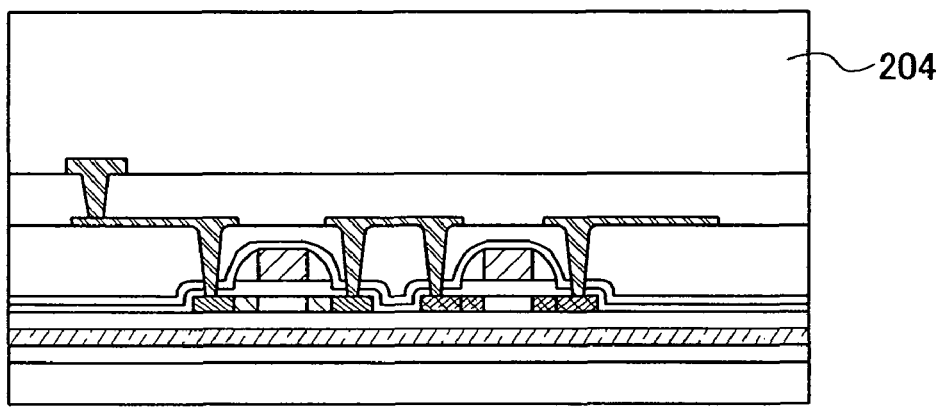

As shown in FIG. 8C, an insulating layer 204 is formed over the electrode 134. The insulating layer 204 corresponds to a second insulating layer 204a and a third insulating layer 224b in FIGS. 2A to 2E and FIGS. 3A to 3F, a second insulating layer 204a, a fourth insulating layer 204b, a sixth insulating layer 204c, and a seventh insulating layer 204d in FIGS. 12A to 12F to FIGS. 15A to 15D. It is to be noted that, instead of the insulating layer 204, an insulating layer corresponding to a first insulating layer 203a in FIGS. 2A to 2E and FIGS. 3A to 3F, a first insulating layer 203a, a third insulating layer 203b, and a fifth insulating layer 203c in FIGS. 12A to 12F to FIGS. 15A to 15D may be provided.

Figure 8D:
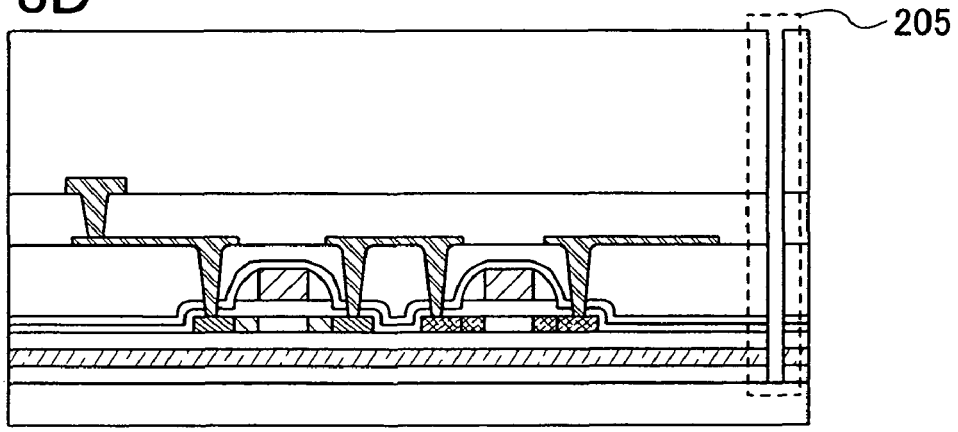

As shown in FIG. 8D, an opening 205 is provided. The opening 205 is provided in the same method as that shown in FIG. 2C in Embodiment Mode 1. The opening 205 is provided so that part of the peeling layer 712 is exposed. In any of the steps shown in FIGS. 2A to 2E, FIGS. 3A to 3F, and FIGS. 12A to 12F to FIGS. 15A to 15D, the manufacturing process shown in this embodiment mode can be employed.

When the present invention is applied to a method for manufacturing an RFID (radio frequency identification) tag (also referred to as a wireless tag, an IC tag, an IC chip, an RF tag, an electronic tag, or a transponder), the electrode 134 can be an electrode connected to an electrode 332 shown in FIG. 6B. It is to be noted that an antenna may be formed over an insulating surface where the electrode 134 is formed (that is, the surface of the fourth insulating layer 669). When the antenna is formed over the insulating surface where the electrode 134 is formed (that is, the surface of the fourth insulating layer 669) (when the antenna is formed with the semiconductor integrated circuit), the step of connecting the semiconductor integrated circuits separated from the first substrate 100 to the antenna is not necessary. Therefore, an RFID tag can be manufactured at low cost.

Consequently, a method for manufacturing a highly reliable semiconductor device at low cost can be provided.

This embodiment mode can be implemented by being freely combined with Embodiment Modes 1 to 4.

Embodiment 1

In this embodiment, a structure of an RFID tag which can be manufactured by the present invention will be explained. Moreover, a wireless communication system using the RFID tag will be explained.

FIG. 16A shows a structure of a wireless communication system including an RFID tag 3000 and a reader/writer 2201 for exchanging data with the RFID tag 3000 by wireless communication. The RFID tag 3000 includes an antenna 2202 and a circuit portion 2203 which inputs and outputs signals to/from the antenna 2202. The circuit portion 2203 corresponds to the semiconductor integrated circuit explained in Embodiment Modes. The reader/writer 2201 includes an antenna 2206 and a circuit portion 2207 which inputs and outputs signals to/from the antenna 2206. The RFID tag 3000 and the reader/writer 2201 input and output data, by transmitting and receiving a modulated carrier wave (also referred to as a wireless signal) using the antenna 2202 and the antenna 2206. The circuit portion 2203 includes an analog portion 2204 and a digital portion 2205. The analog portion 2204 inputs and outputs signals to/from the antenna 2202. The digital portion 2205 inputs and outputs signals to/from the analog portion 2204.

FIG. 16B shows a structure of the analog portion 2204 and the digital portion 2205. The analog portion 2204 includes a resonant capacitor 2501, a band-pass filter 2502, a power supply circuit 2503, a demodulation circuit 2506, and a modulation circuit 2507. The resonant capacitor 2501 is provided so that the antenna 2202 can easily receive a signal at a predetermined frequency. The digital portion 2205 includes a code extraction circuit 2301, a code determination circuit 2302, a cyclic redundancy check circuit 2303, a memory circuit 2305, and a control circuit 2304.

A case where the RFID tag 3000 receives data will be explained. A modulated carrier wave input from the antenna 2202, from which noise is removed by the band-pass filter 2502, is input to the power supply circuit 2503 and the demodulation circuit 2506. The power supply circuit 2503 has a rectifier circuit and a storage capacitor. The modulated carrier wave input through the band-pass filter 2502 is rectified by the rectifier circuit and smoothed by the storage capacitor. In this manner, the power supply circuit 2503 generates a DC voltage. The DC voltage generated in the power supply circuit 2503 is supplied as a power supply voltage to each circuit in the circuit portion 2203 included in the RFID tag 3000. It is to be noted that the power supply voltage output from the power supply circuit 2503 may be supplied to each circuit in the circuit portion 2203 through a constant voltage circuit (a regulator). The modulated carrier wave input through the band-pass filter 2502 is demodulated by the demodulation circuit 2506, and the demodulated signal is input to the digital portion 2205. A signal input from the analog portion 2204, that is, a signal which is made by demodulating the modulated carrier wave by the demodulation circuit 2506, is input to the code extraction circuit 2301, and a code of the signal is extracted. An output of the code extraction circuit 2301 is input to the code determination circuit 2302, and the extracted code is analyzed. The analyzed code is input to the cyclic redundancy check circuit 2303, and an arithmetic processing for identifying a transmission error is performed. Then, the cyclic redundancy check circuit 2303 outputs a result whether the received data has an error or not to the control circuit 2304. It is to be noted that a phase synchronization circuit generating a clock at a predetermined frequency, which is synchronized with a signal, using an output of the demodulation circuit 2506 may be included. As the phase synchronization circuit, a phase locked loop circuit (a PLL circuit) can be used.

Next, a case where the RFID tag 3000 transmits data will be explained. The memory circuit 2305 outputs a stored unique identifier (UID) to the control circuit 2304, depending on a signal input from the code determination circuit 2302. The memory circuit includes a memory, and a memory controller which controls reading of data from the memory. A mask ROM can be used as the memory. The cyclic redundancy check circuit 2303 calculates the CRC code corresponding to the transmitted data and outputs the CRC code to the control circuit 2304. The control circuit 2304 adds the CRC code to the transmitted data. The control circuit 2304 encodes data in which the CRC code is added to the transmitted data. In addition, the control circuit 2304 converts the encoded information into a signal for modulating the carrier wave in accordance with a predetermined modulation method. The output of the control circuit 2304 is input to the modulation circuit 2507 of the analog portion 2204. The modulation circuit 2507 load-modulates the carrier wave depending on the input signal and outputs the carrier wave to the antenna 2202.

By the method for manufacturing a semiconductor device (an RFID tag) of the present invention, a large division margin when dividing a plurality of semiconductor integrated circuits transferred to a substrate which differs from a first substrate into separate pieces can be obtained. In addition, the number of RFID tags that can be manufactured from one first substrate can be increased. Therefore, a method for manufacturing a highly reliable RFID tag at low cost can be provided.

This embodiment can be implemented by being freely combined with the embodiment modes described above.

Embodiment 2

In this embodiment, a manufacturing method of a memory (corresponding to a memory included in the memory circuit 2305 in FIGS. 16A and 16B) included in an RFID tag which can be manufactured by the present invention will be explained. An example of using a mask ROM as the memory will be explained.

The mask ROM is formed using a plurality of transistors, and the transistor which forms the mask ROM is formed using photolithography. In the case, a selection is conducted whether a contact hole for a wiring connected to, for example, a drain region of the transistor is opened or not in an interlayer insulating film formed over the transistor. Thus, different data can be written. For example, data of a logical value "1" can be written into a memory cell in a case where the contact hole is opened, and alternatively, data of a logical value "0" can be written into the memory cell in a case where the contact hole is not opened.

In a step of exposing a photoresist, before or after a step of conducting exposure through a reticle (a photomask) by using an exposure apparatus such as a stepper, a photoresist over a region in which the contact hole is to be opened is irradiated with an electron beam or a laser. Thereafter, a step such as development, etching, or peeling of a photoresist is normally conducted. Accordingly, only by selecting a region to be irradiated with an electron beam or a laser, a pattern in which the contact hole is opened and a pattern in which the contact hole is not opened can be separately formed without changing a reticle (a photomask). In other words, by selecting the region to be irradiated with an electron beam or a laser, a mask ROM in which different data is written in each semiconductor device can be manufactured without changing a reticle (a photomask).

By using such a manufacturing method of a mask ROM, a unique identifier (UID) can be set for each semiconductor device in manufacturing. The reticle (a photomask) is not necessary to be changed also in a case of setting a different UID; therefore, a semiconductor device can be manufactured at lower cost.

Further, an RFID tag which can be manufactured by the present invention may include, instead of a mask ROM, a memory capable of additional writing or a memory capable of rewriting. In addition, the mask ROM, and the memory capable of additional writing and/or the memory capable of rewriting may be included.

By the method for manufacturing a semiconductor device (an RFID tag) of the present invention, a large division margin when dividing a plurality of semiconductor integrated circuits transferred to a substrate which differs from a first substrate into separate pieces can be obtained. In addition, the number of RFID tags that can be manufactured from one first substrate can be increased. Therefore, a method for manufacturing a highly reliable RFID tag at low cost can be provided.

This embodiment can be implemented by being freely combined with the embodiment modes and Embodiment 1 described above.

Embodiment 3

In this embodiment, a carrier wave of wireless communication in an RFID tag which can be manufactured by the present invention will be explained.

As for a frequency of a carrier wave, any of the following can be employed: a submillimeter wave of greater than or equal to 300 GHz and less than or equal to 3 THz; an extra high frequency of greater than or equal to 30 GHz and less than 300 GHz; a super high frequency of greater than or equal to 3 GHz and less than 30 GHz; an ultra high frequency of greater than or equal to 300 MHz and less than 3 GHz; a very high wave of greater than or equal to 30 MHz and less than 300 MHz; a high frequency of greater than or equal to 3 MHz and less than 30 MHz; a medium frequency of greater than or equal to 300 KHz and less than 3 MHz; a low frequency of greater than or equal to 30 KHz and less than 300 KHz; and a very low frequency of greater than or equal to 3 KHz and less than 30 KHz. For example, a carrier wave at a frequency of 13.56 MHz may be used or a carrier wave at a frequency of 2.45 GHz may be used.

A shape of the antenna included in the RFID tag can be changed in accordance with the frequency of a carrier wave or a transmission system. For example, the antenna may have a coil shape in a case of utilizing an electromagnetic induction type, or the antenna may have a dipole shape in a case of utilizing a microwave type.

By the method for manufacturing a semiconductor device (an RFID tag) of the present invention, a large division margin when dividing a plurality of semiconductor integrated circuits transferred to a substrate which differs from a first substrate into separate pieces can be obtained. In addition, the number of RFID tags that can be manufactured from one first substrate can be increased. Therefore, a method for manufacturing a highly reliable RFID tag at low cost can be provided.

This embodiment can be implemented by being freely combined with the embodiment modes and Embodiments 1 and 2 described above.

Embodiment 4

Figure 10A:
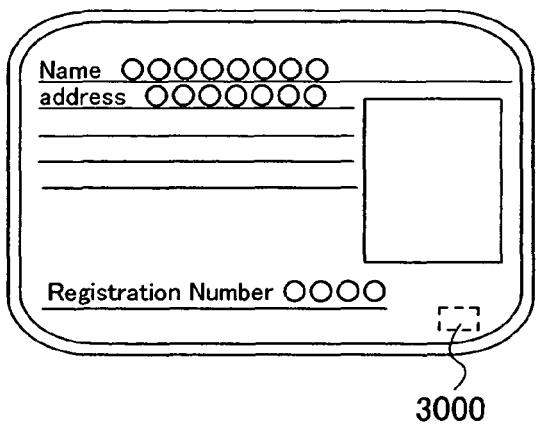
FIGS. 10A to 10E are views each showing a structure of Embodiment 4.
Figure 10B:
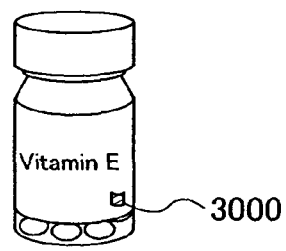
Figure 10C:
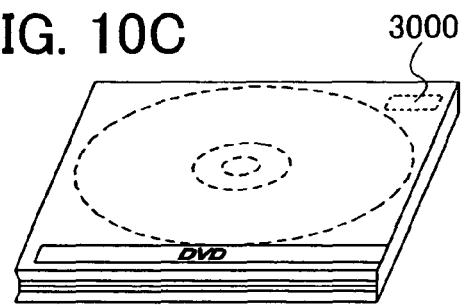
Figure 10D:
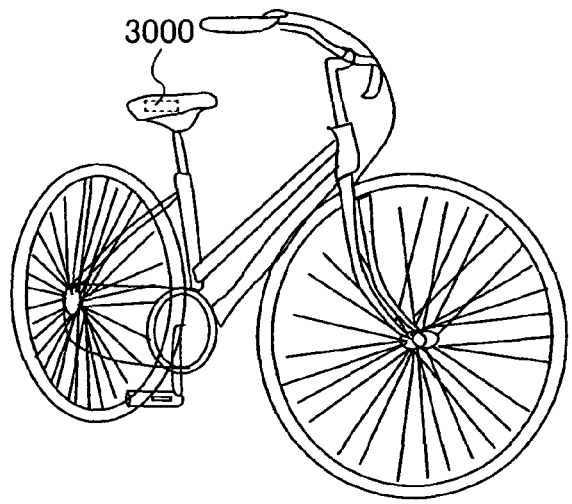
Figure 10E:
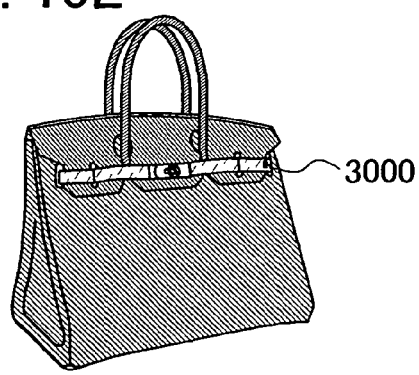

In this embodiment, applications of an RFID tag which can be manufactured by the present invention will be explained with reference to FIGS. 10A to 10E. An RFID tag 3000 has a feature that an antenna is provided and data is input and output by wireless communication through the antenna. The RFID tag 3000 can be applied to paper money, coins, securities, unregistered bonds, documents (a driver's license or a resident's card; FIG. 10A), packaging containers (wrapping paper or a bottle; FIG. 10B), recording media (FIG. 10C) such as DVD software, a CD, and a video tape. In addition, the RFID tag 3000 can be applied to vehicles (FIG. 10D) such as cars, motor bicycles, and bicycles, personal belongings (FIG. 10E) such as bags and glasses, groceries, clothes, daily commodities, electronic devices, and the like. The electronic apparatuses include liquid crystal display devices, EL (electroluminescence) display devices, television devices (also simply referred to as televisions or television receivers), portable phones, and the like.

The RFID tag 3000 can be attached to a surface of an object or embedded in an object to be fixed. For example, the RFID tag 3000 is preferably embedded in a paper of a book or in an organic resin of a package which is formed using the organic resin. By providing the RFID tag 3000 in paper money, coins, securities, unregistered bonds, documents, or the like, forgery thereof can be prevented. Moreover, by providing the RFID tag 3000 in packaging containers, recording media, personal belongings, groceries, clothes, daily commodities, electronic devices, or the like, efficiency of an inspection system or a system of a rental shop can be facilitated. Moreover, by providing the RFID tag 3000 in vehicles, forgery or theft thereof can be prevented. By implanting the RFID tag 3000 in living things such as animals, each living thing can be easily identified. For example, by implanting the RFID tag 3000 in living things such as domestic animals, its year of birth, sex, breed, and the like can be easily identified.

By the method for manufacturing a semiconductor device (an RFID tag) of the present invention, a large division margin when dividing a plurality of semiconductor integrated circuits transferred to a substrate which differs from a first substrate into separate pieces can be obtained. In addition, the number of RFID tags that can be manufactured from one first substrate can be increased. Therefore, the highly reliable RFID tag at low cost can be provided.

This embodiment can be implemented by being freely combined with the embodiment modes and Embodiments 1 to 3 described above.

Embodiment 5

Figure 11A:
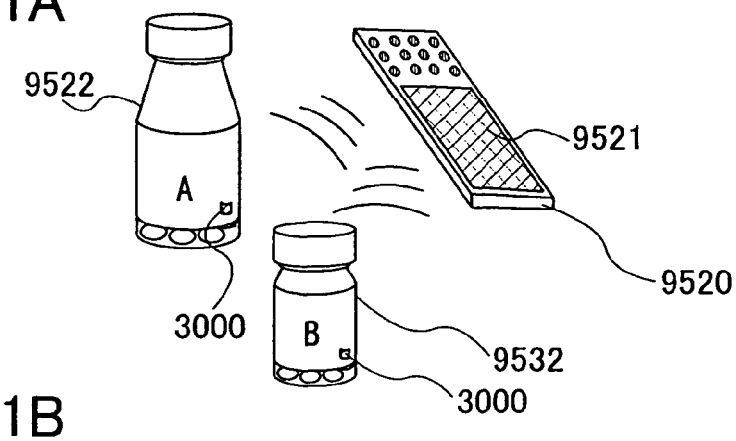
FIGS. 11A to 11C are views each showing a structure of Embodiment 5.
Figure 11B:
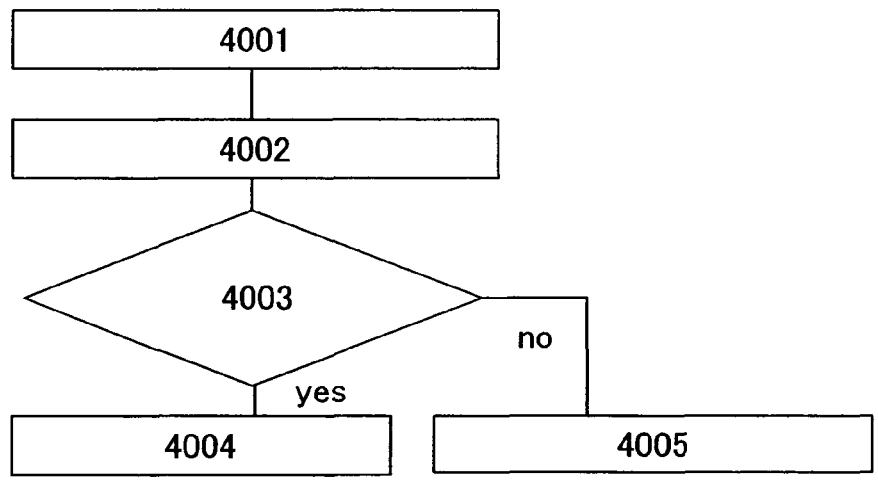

In this embodiment, one mode of a wireless communication system utilizing an RFID tag 3000 which can be manufactured by the present invention will be explained with reference to FIGS. 11A to 11C. A terminal 9520 including a display portion 9521 is provided with an antenna and a reader/writer connected to the antenna. An object A 9522 is provided with an RFID tag 3000, and an object B 9532 is also provided with an RFID tag 3000. In FIG. 11A, an internal medicine is shown as an example of the object A or the object B. When the antenna of the terminal 9520 is held near the RFID tag 3000 of the object A 9522, the display portion 9521 displays information on the object A 9522, such as a raw material, a place of origin, a test result in each production process, a record of distribution process, and description of the object. When the antenna of the terminal 9520 is held near the RFID tag 3000 of the object B 9532, the display portion 9521 displays information on the object B 9532, such as a raw material, a place of origin, a test result in each production process, a record of distribution process, and description of the object.

An example of a business model utilizing the system shown in FIG. 11A will be explained with reference to a flow chart shown in FIG. 11B. Information on allergy is input to the terminal 9520 (a first step 4001). The information on allergy is information on medical products, their components, or the like that may cause allergic reactions to certain people. As described above, information on the internal medicine A, which is the object A 9522, is obtained by the antenna provided for the terminal 9520 (a second step 4002). The information on the internal medicine A includes information on the components or the like of the internal medicine A. The information on allergy is compared with the obtained information on components or the like of the internal medicine A, thereby determining whether corresponding component is contained or not (a third step 4003). If the corresponding component is contained, a user of the terminal 9520 is alerted that certain people may have allergic reactions to the internal medicine A (a fourth step 4004). If the corresponding component is not contained, the user of the terminal 9520 is informed that certain people are at low risk of having allergic reactions to the internal medicine A (the fact that the internal medicine A is safe) (a fifth step 4005). In the fourth 4004 or the fifth step 4005, in order to inform the user of the terminal 9520 of the information, the information may be displayed on the display portion 9521 of the terminal 9520 or an alarm of the terminal 9520 or the like may be sounded.

Figure 11C:
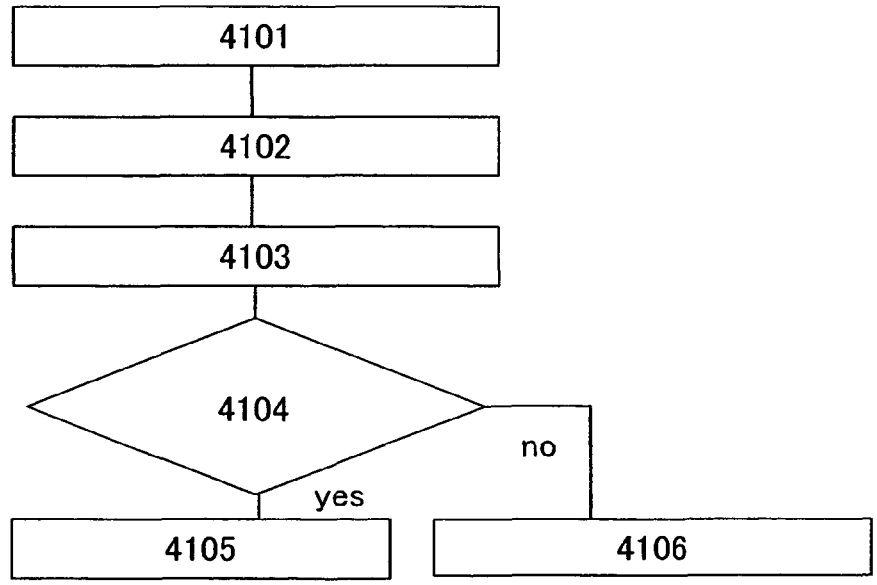

Alternatively, FIG. 11C shows another example of a business model. Information on a combination of internal medicines which are dangerous when used simultaneously or a combination of components of internal medicines which are dangerous when used simultaneously (hereinafter, referred to as combination information) is input to the terminal 9520 (a first step 4101). As described above, information on the internal medicine A, which is the object A 9522, is obtained by an antenna provided for the terminal 9520 (a second step 4102). The information on the internal medicine A includes information on components and the like of the internal medicine A. Next, as described above, information on the internal medicine B, which is the object B 9532, is obtained by the antenna provided for the terminal 9520 (a third step 4103). The information on the internal medicine B includes information on components and the like of the internal medicine B. In this way, information on a plurality of internal medicines is obtained. The combination information is compared with the obtained information on the plurality of internal medicines, thereby determining whether or not a corresponding combination of components of internal medicines which are dangerous when used simultaneously is contained (a fourth step 4104). If the corresponding combination is contained, the user of the terminal 9520 is alerted (a fifth step 4105). If the corresponding combination is not contained, the user of the terminal 9520 is informed of the safety (a sixth step 4106). In the fifth step 4105 or the sixth step 4106, in order to inform the user of the terminal 9520 of the information, the information may be displayed on the display portion 9521 of the terminal 9520 or an alarm of the terminal or the like may be sounded.

By the method for manufacturing a semiconductor device (an RFID tag) of the present invention, a large division margin when dividing a plurality of semiconductor integrated circuits transferred to a substrate which differs from a first substrate into separate pieces can be obtained. In addition, the number of RFID tags that can be manufactured from one first substrate can be increased. Therefore, the highly reliable RFID tag at low cost can be provided.

This embodiment can be implemented by being freely combined with the embodiment modes and Embodiments 1 to 4 described above.

This application is based on Japanese Patent Application serial no. 2005-348872 filed in Japan Patent Office on Dec. 2 in 2005, the entire contents of which are hereby incorporated by reference.

What is claimed is:

1. A method for manufacturing a semiconductor device, comprising:

forming a plurality of first semiconductor integrated circuits and a plurality of second semiconductor integrated circuits arranged over a first substrate so that each of the second semiconductor integrated circuits is adjacent to one of the first semiconductor integrated circuits;

attaching a second substrate so as to cover the first semiconductor integrated circuits and the second semiconductor integrated circuits;

separating the first substrate and the second substrate from each other by etching and transferring the first semiconductor integrated circuits to the second substrate;

attaching a third substrate so as to cover the second semiconductor integrated circuits remaining over the first substrate;

separating the first substrate and the third substrate from each other and transferring the second semiconductor integrated circuits to the third substrate;

dividing the second substrate in a direction parallel to a diagonal direction of the plurality of the first integrated circuits so as to divide the plurality of first semiconductor integrated circuits into separate pieces; and dividing the third substrate in a direction parallel to a diagonal direction of the plurality of the second integrated circuits so as to divide the plurality of second semiconductor integrated circuits into separate pieces.

2. A method for manufacturing a semiconductor device according to claim 1, further comprising forming a peeling layer between the first substrate and the first semiconductor integrated circuits and between the first substrate and the second semiconductor integrated circuits.

3. A method for manufacturing a semiconductor device according to claim 1, wherein the first semiconductor integrated circuits and the second semiconductor integrated circuits are formed over the first substrate by a same step.

4. A method for manufacturing a semiconductor device according to claim 1, wherein the first semiconductor integrated circuits and the second semiconductor integrated circuits have a same structure.

5. A method for manufacturing a semiconductor device according to claim 1, wherein the first semiconductor integrated circuits and the second semiconductor integrated circuits have different structures.

6. A method for manufacturing a semiconductor device according to claim 1,
wherein the first semiconductor integrated circuits or the second semiconductor integrated circuits are electrically connected to an antenna, and
wherein data is input and output by wireless communication through the antenna.

7. A method for manufacturing a semiconductor device, comprising:
forming a plurality of first semiconductor integrated circuits and a plurality of second semiconductor integrated circuits arranged over a first substrate so that each of the second semiconductor integrated circuits is adjacent to one of the first semiconductor integrated circuits;
attaching a second substrate so as to cover the first semiconductor integrated circuits and the second semiconductor integrated circuits;
separating the first substrate and the second substrate from each other by etching and transferring the first semiconductor integrated circuits to the second substrate;
attaching a third substrate so as to cover the second semiconductor integrated circuits remaining over the first substrate;
separating the first substrate and the third substrate from each other and transferring the second semiconductor integrated circuits to the third substrate;
transferring the first semiconductor integrated circuits to a fourth substrate after transferring the first semiconductor integrated circuits to the second substrate, and dividing the fourth substrate in a direction parallel to a diagonal direction of the plurality of the first integrated circuits so as to divide the plurality of first semiconductor integrated circuits into separate pieces; and
transferring the second semiconductor integrated circuits to a fifth substrate after transferring the second semiconductor integrated circuits to the third substrate, and dividing the fifth substrate in a direction parallel to a diagonal direction of the plurality of the second integrated circuits so as to divide the plurality of second semiconductor integrated circuits into separate pieces.

8. A method for manufacturing a semiconductor device according to claim 7, further comprising forming a peeling layer between the first substrate and the first semiconductor integrated circuits and between the first substrate and the second semiconductor integrated circuits.

9. A method for manufacturing a semiconductor device according to claim 7, wherein the first semiconductor integrated circuits and the second semiconductor integrated circuits are formed over the first substrate by a same step.

10. A method for manufacturing a semiconductor device according to claim 7, wherein the first semiconductor integrated circuits and the second semiconductor integrated circuits have a same structure.

11. A method for manufacturing a semiconductor device according to claim 7, wherein the first semiconductor integrated circuits and the second semiconductor integrated circuits have different structures.

12. A method for manufacturing a semiconductor device according to claim 7,
wherein the first semiconductor integrated circuits or the second semiconductor integrated circuits are electrically connected to an antenna, and
wherein data is input and output by wireless communication through the antenna.

13. A method for manufacturing a semiconductor device, comprising:
forming a plurality of first semiconductor integrated circuits and a plurality of second semiconductor integrated circuits arranged over a first substrate so that each of the second semiconductor integrated circuits is adjacent to one of the first semiconductor integrated circuits;
forming a first insulating layer so as to cover the second semiconductor integrated circuits;
forming a second insulating layer so as to cover the first semiconductor integrated circuits;
attaching a second substrate so as to cover the first insulating layer and the second insulating layer;
separating the first substrate and the second substrate from each other by etching and by applying a first external force between the second substrate and the first substrate, and transferring the first semiconductor integrated circuits to the second substrate;
attaching the third substrate so as to cover the second semiconductor integrated circuits remaining over the first substrate;
separating the first substrate and the third substrate from each other by applying a second external force between the first substrate and the third substrate, and transferring the second semiconductor integrated circuits to the third substrate;
dividing the second substrate in a direction parallel to a diagonal direction of the plurality of the first integrated circuits so as to divide the plurality of first semiconductor integrated circuits into separate pieces; and
dividing the third substrate in a direction parallel to a diagonal direction of the plurality of the second integrated circuits so as to divide the plurality of second semiconductor integrated circuits into separate pieces.

14. A method for manufacturing a semiconductor device according to claim 13, wherein the second insulating layer is formed using a resin material having an epoxy group and the first insulating layer is formed using a resin material having a vinyl group.

15. A method for manufacturing a semiconductor device according to claim 13, further comprising forming a peeling layer between the first substrate and the first semiconductor integrated circuits and between the first substrate and the second semiconductor integrated circuits.

16. A method for manufacturing a semiconductor device according to claim 13, wherein the first semiconductor integrated circuits and the second semiconductor integrated circuits are formed over the first substrate by a same step.

17. A method for manufacturing a semiconductor device according to claim 13, wherein the first semiconductor integrated circuits and the second semiconductor integrated circuits have a same structure.

18. A method for manufacturing a semiconductor device according to claim 13, wherein the first semiconductor integrated circuits and the second semiconductor integrated circuits have different structures.

19. A method for manufacturing a semiconductor device according to claim 13,
wherein the first semiconductor integrated circuits or the second semiconductor integrated circuits are electrically connected to an antenna, and
wherein data is input and output by wireless communication through the antenna.

20. A method for manufacturing a semiconductor device, comprising:
forming a plurality of first semiconductor integrated circuits and a plurality of second semiconductor integrated circuits arranged over a first substrate so that each of the second semiconductor integrated circuits is adjacent to one of the first semiconductor integrated circuits;
forming a first insulating layer so as to cover the second semiconductor integrated circuits;
forming a second insulating layer so as to cover the first semiconductor integrated circuits;
attaching a second substrate so as to cover the first insulating layer and the second insulating layer;
separating the first substrate and the second substrate from each other by etching and by applying a first external force between the second substrate and the first substrate, and transferring the first semiconductor integrated circuits to the second substrate;
attaching a third substrate so as to cover the second semiconductor integrated circuits remaining over the first substrate;
separating the first substrate and the third substrate from each other by applying a second external force between the first substrate and the third substrate and transferring the second semiconductor integrated circuits to the third substrate;
transferring the first semiconductor integrated circuits to a fourth substrate after transferring the first semiconductor integrated circuits to the second substrate, and dividing the fourth substrate in a direction parallel to a diagonal direction of the plurality of the first integrated circuits so as to divide the plurality of first semiconductor integrated circuits into separate pieces; and
transferring the second semiconductor integrated circuits to a fifth substrate after transferring the second semiconductor integrated circuits to the third substrate, and dividing the fifth substrate in a direction parallel to a diagonal direction of the plurality of the second integrated circuits so as to divide the plurality of second semiconductor integrated circuits into separate pieces.

21. A method for manufacturing a semiconductor device according to claim 20, wherein the second insulating layer is formed using a resin material having an epoxy group and the first insulating layer is formed using a resin material having a vinyl group.

22. A method for manufacturing a semiconductor device according to claim 20, further comprising forming a peeling layer between the first substrate and the first semiconductor integrated circuits and between the first substrate and the second semiconductor integrated circuits.

23. A method for manufacturing a semiconductor device according to claim 20, wherein the first semiconductor integrated circuits and the second semiconductor integrated circuits are formed over the first substrate by a same step.

24. A method for manufacturing a semiconductor device according to claim 20, wherein the first semiconductor integrated circuits and the second semiconductor integrated circuits have a same structure.

25. A method for manufacturing a semiconductor device according to claim 20, wherein the first semiconductor integrated circuits and the second semiconductor integrated. circuits have different structures.

26. A method for manufacturing a semiconductor device according to claim 20,
wherein the first semiconductor integrated circuits or the second semiconductor integrated circuits are electrically connected to an antenna, and
wherein data is input and output by wireless communication through the antenna.

27. A method for manufacturing a semiconductor device, comprising:
forming a plurality of first semiconductor integrated circuits and a plurality of second semiconductor integrated circuits arranged over a first substrate so that each of the second semiconductor integrated circuits is adjacent to one of the first semiconductor integrated circuits;
forming a first insulating layer so as to cover the second semiconductor integrated circuits;
forming a second insulating layer so as to cover the first semiconductor integrated circuits;
attaching a second substrate so as to cover the first insulating layer and the second insulating layer; and
separating the first substrate and the second substrate from each other by etching and by applying a first external force between the second substrate and the first substrate,
wherein, with respect to the first external force, adhesive strength between the second insulating layer and the first semiconductor integrated circuits is higher than adhesive strength between the first insulating layer and the second semiconductor integrated circuits and adhesive strength between the first substrate and the first semiconductor integrated circuits, and
wherein, with respect to the first external force, junction strength between the first substrate and the second semiconductor integrated circuits is higher than adhesive strength between the first insulating layer and the second semiconductor integrated circuits,
attaching a third substrate so as to cover the second semiconductor integrated circuits over the first substrate after separating the second substrate;
separating the first substrate and the third substrate from each other by applying a second external force between the first substrate and the third substrate and transferring the second semiconductor integrated circuits to the third substrate;
dividing the second substrate in a direction parallel to a diagonal direction of the plurality of the first integrated circuits so as to divide the plurality of first semiconductor integrated circuits into separate pieces; and
dividing the third substrate in a direction parallel to a diagonal direction of the plurality of the second integrated circuits so as to divide the plurality of second semiconductor integrated circuits into separate pieces.

28. A method for manufacturing a semiconductor device according to claim 27, wherein the second insulating layer is formed using a resin material having an epoxy group and the first insulating layer is formed using a resin material having a vinyl group.

29. A method for manufacturing a semiconductor device according to claim 27, further comprising forming a peeling layer between the first substrate and the first semiconductor integrated circuits and between the first substrate and the second semiconductor integrated circuits.

30. A method for manufacturing a semiconductor device according to claim 27, wherein the first semiconductor integrated circuits and the second semiconductor integrated circuits are formed over the first substrate by a same step.

31. A method for manufacturing a semiconductor device according to claim 27, wherein the first semiconductor integrated circuits and the second semiconductor integrated circuits have a same structure.

32. A method for manufacturing a semiconductor device according to claim 27, wherein the first semiconductor integrated circuits and the second semiconductor integrated circuits have different structures.

33. A method for manufacturing a semiconductor device according to claim 27,
wherein the first semiconductor integrated circuits or the second semiconductor integrated circuits are electrically connected to an antenna, and
wherein data is input and output by wireless communication through the antenna.

34. A method for manufacturing a semiconductor device, comprising:
forming a plurality of first semiconductor integrated circuits and a plurality of second semiconductor integrated circuits arranged over a first substrate so that each of the second semiconductor integrated circuits is adjacent to one of the first semiconductor integrated circuits;
forming a first insulating layer so as to cover the second semiconductor integrated circuits;
forming a second insulating layer so as to cover the first semiconductor integrated circuits;
attaching a second substrate so as to cover the first insulating layer and the second insulating layer; and
separating the first substrate and the second substrate from each other by etching and by applying a first external force between the second substrate and the first substrate,
wherein, with respect to the first external force, adhesive strength between the second insulating layer and the first semiconductor integrated circuits is higher than adhesive strength between the first insulating layer and the second semiconductor integrated circuits and adhesive strength between the first substrate and the first semiconductor integrated circuits, and
wherein, with respect to the first external force, junction strength between the first substrate and the second semiconductor integrated circuits is higher than adhesive strength between the first insulating layer and the second semiconductor integrated circuits,
attaching a third substrate so as to cover the second semiconductor integrated circuits over the first substrate after separating the second substrate;
separating the first substrate and the third substrate from each other by applying a second external force between the first substrate and the third substrate and transferring the second semiconductor integrated circuits to the third substrate;
transferring the first semiconductor integrated circuits to a fourth substrate after transferring the first semiconductor integrated circuits to the second substrate, and dividing the fourth substrate in a direction parallel to a diagonal direction of the plurality of the first integrated circuits so as to divide the plurality of first semiconductor integrated circuits into separate pieces; and
transferring the second semiconductor integrated circuits to a fifth substrate after transferring the second semiconductor integrated circuits to the third substrate, and dividing the fifth substrate in a direction parallel to a diagonal direction of the plurality of the second integrated circuits so as to divide the plurality of second semiconductor integrated circuits into separate pieces.

35. A method for manufacturing a semiconductor device according to 34, wherein the second insulating layer is formed using a resin material having an epoxy group and the first insulating layer is formed using a resin material having a vinyl group.

36. A method for manufacturing a semiconductor device according to claim 34, further comprising forming a peeling layer between the first substrate and the first semiconductor integrated circuits and between the first substrate and the second semiconductor integrated circuits.

37. A method for manufacturing a semiconductor device according to claim 34, wherein the first semiconductor integrated circuits and the second semiconductor integrated circuits are formed over the first substrate by a same step.

38. A method for manufacturing a semiconductor device according to claim 34, wherein the first semiconductor integrated circuits and the second semiconductor integrated circuits have a same structure.

39. A method for manufacturing a semiconductor device according to claim 34, wherein the first semiconductor integrated circuits and the second semiconductor integrated circuits have different structures.

40. A method for manufacturing a semiconductor device according to claim 34,
wherein the first semiconductor integrated circuits or the second semiconductor integrated circuits are electrically connected to an antenna, and
wherein data is input and output by wireless communication through the antenna.

* * * * *